US006011279A

United States Patent [19]

Singh et al.

[11] Patent Number: 6,011,279

[45] Date of Patent: Jan. 4, 2000

[54] SILICON CARBIDE FIELD CONTROLLED BIPOLAR SWITCH

[75] Inventors: Ranbir Singh, Cary; John W. Palmour, Raleigh, both of N.C.

[73] Assignee: Cree Research, Inc., Durham, N.C.

[21] Appl. No.: 08/846,286

[22] Filed: Apr. 30, 1997

[51] Int. Cl.[7] .................... H01L 31/0312; H01L 27/082; H01L 27/102

[52] U.S. Cl. ........................... 257/77; 257/565; 257/577; 257/587

[58] Field of Search ............................ 257/77, 565, 577, 257/587

[56] References Cited

U.S. PATENT DOCUMENTS

| | | | |
|---|---|---|---|
| 4,037,245 | 7/1977 | Ferro | 357/38 |
| 4,060,821 | 11/1977 | Houston et al. | 357/22 |
| 4,132,996 | 1/1979 | Baliga | 357/21 |
| 4,171,995 | 10/1979 | Nishizawa et al. | 148/175 |
| 4,223,328 | 9/1980 | Terasawa et al. | 357/22 |
| 4,466,173 | 8/1984 | Baliga | 29/571 |
| 4,569,118 | 2/1986 | Baliga et al. | 29/571 |
| 4,571,815 | 2/1986 | Baliga et al. | 29/571 |
| 4,587,712 | 5/1986 | Baliga | 29/571 |
| 4,937,644 | 6/1990 | Baliga | 357/38 |
| 4,994,883 | 2/1991 | Chang et al. | 357/38 |
| 5,087,576 | 2/1992 | Edmond et al. | 437/22 |
| 5,202,750 | 4/1993 | Gough | 257/133 |
| 5,369,291 | 11/1994 | Swanson | 257/130 |
| 5,387,805 | 2/1995 | Metzler et al. | 257/147 |
| 5,449,925 | 9/1995 | Baliga et al. | 257/77 |
| 5,471,075 | 11/1995 | Shekar et al. | 257/139 |
| 5,489,787 | 2/1996 | Amaratunga et al. | 257/137 |
| 5,539,217 | 7/1996 | Edmond et al. | 257/77 |
| 5,554,561 | 9/1996 | Plumton | 437/89 |
| 5,612,547 | 3/1997 | Clarke et al. | 257/77 |

FOREIGN PATENT DOCUMENTS

| | | | |
|---|---|---|---|
| 0701288 A2 | 3/1996 | European Pat. Off. . | |
| 19644821 C1 | 10/1996 | Germany . | |
| 94 11 601 U | 7/1994 | United Kingdom . | |
| WO 95/05006 | 2/1995 | WIPO | H01L 29/74 |
| WO95/05006 | 2/1995 | WIPO . | |
| WO95/07548 | 3/1995 | WIPO . | |
| WO95/34915 | 12/1995 | WIPO . | |
| WO97/36317 | 10/1997 | WIPO . | |

OTHER PUBLICATIONS

Singh, et al., Cryogenic Operation of Asymmetric Field Controlled Thyristors, *Solid–State Electronics*, vol. 38, No. 12, pp. 2063–2067 (1995).

Baliga, New Materials Beyond Silicon for Power Devices, *Power Semiconductor Devices and Circuits*, pp. 377–389 (1992).

Assalit, et al., Description of a Technique for the Reduction of Thyristor Turn–Off Time, *IEEE Transactions on electron devices*, vol. ED21, No. 7, pp. 416–420 (Jul. 1974).

Ogura, et al., High Frequency 6000 V Double Gate GTOs, *IEEE*, pp. 610–613 (1988).

Dmitriev, et al., First SiC Dynistor, *Electonics Letters*, vol. 24, No. 16, pp. 1031–1033 (Aug. 4, 1988).

*Primary Examiner*—Ngan V. Ngo

*Attorney, Agent, or Firm*—Myers Bigel Sibley & Sajovec; Philip Summa

[57] ABSTRACT

A field controlled bipolar switch having a bulk single crystal silicon carbide substrate of a first conductivity type having an upper surface and a lower surface. A first epitaxial layer of a second conductivity type silicon carbide is formed upon the upper surface of the substrate. A second epitaxial layer of the second conductivity type silicon carbide is formed on the first epitaxial layer of silicon carbide. A plurality of regions of a third conductivity type silicon carbide are formed in the second epitaxial layer to form a gate grid in the second epitaxial layer. A third epitaxial layer of the second conductivity type silicon carbide is formed on the second epitaxial layer and a fourth epitaxial layer of the second conductivity type silicon carbide is formed upon the third epitaxial layer. The fourth epitaxial layer has a higher carrier concentration than is present in the first, second and third epitaxial layers. A first ohmic contact is formed upon the fourth epitaxial layer and a second ohmic contact is formed on the lower surface of the substrate. An ohmic gate contact is connected to the gate grid for pinching off the flow of current between the first ohmic contact and the second ohmic contact when a bias is applied to the ohmic gate contact.

64 Claims, 12 Drawing Sheets

SILICON CARBIDE FIELD CONTROLLED BIPOLAR SWITCH

FIELD OF THE INVENTION

The present invention relates to field controlled devices, and more particularly to such devices formed in silicon carbide.

BACKGROUND OF THE INVENTION

As demands for higher speed, higher power circuits increase, the need for devices having faster switching speeds, higher current carrying capability and increased reverse bias breakdown voltages has also increased. Applications such as power modules for motor and generator control, electronic ballasts for lighting control, industrial robots, display drivers, automotive ignition and automation control would all benefit from higher power, higher speed switches. Unfortunately, existing implementations of higher speed power MOSFETs, IGBTs or MOS controlled thyristors have had limited success in creating devices with very high reverse bias breakdown voltage, a low leakage current, low forward on-state resistance and a high switching speed. Field controlled thyristors have been investigated as high power devices but these devices were limited in their switching speeds. Further development is required to produce a high power, high current device with high switching speeds.

The field controlled bipolar switch is a three terminal device where a P-i-N rectifier structure has a gate structure introduced to control the current flow between the anode and cathode terminals. Because these devices can operate under a high level of injected minority carriers in the drift region, field controlled thyristors operate at very high current densities with a low forward voltage drop. Unfortunately, because of the high level of injected minority carriers, field controlled thyristors were incapable of operating at high frequencies. In fact, the stored minority carriers in the drift region has limited the switching speed of previous devices to below 1 Mhz. In fact, the typical forced gate turn off times for existing field controlled thyristors are between 1 to 20 $\mu$secs depending upon the designed breakdown voltage of the device and gating techniques. Baliga, B. J., *Modern Power Devices,* 1987, pp. 196–260.

Recently issued U.S. Pat. No. 5,387,805 to Metzler et al. describes a field controlled thyristor where the current path from the anode to the cathode passes through a channel region adjacent a void in the channel layer. The device pinches off the current through utilization of p-type regions which surround the void. This device, however, is limited to current densities below 400 A/cm$^2$ and has a voltage blocking gain of 150 and is limited to gate voltages of 2 to 10 volts. Thus, the maximum theoretical anode voltage attainable by the device would be 1500 volts. Metzler et al. also describes various other patents which relate to field controlled devices. However, as described by Metzler et al., none of these patents describe devices having the characteristics of the devices of the present invention.

For example, U.S. Pat. No. 4,937,644 to Baliga describes an asymmetrical field controlled thyristor. The Baliga patent describes a device which has a DC blocking gain of greater than 60 and claims improved switching speed but provides no data on the switching speed of the device. This device is limited to forward blocking voltages of up to about 2000 volts.

Therefore, there remains a need to develop high performance field controlled devices which exhibit higher breakdown voltages, low on state resistance, higher current capabilities and higher switching speeds.

OBJECT AND SUMMARY OF THE INVENTION

In view of the foregoing, it is one object of the present invention to provide a field controlled device with higher current density capabilities than existing devices. It is another object of the present invention to provide a field controlled device with higher breakdown voltages than previous devices. It is yet another object of the present invention to provide a field controlled device with improved switching speeds over previous field controlled devices.

In view of these objects, one embodiment of the field controlled bipolar switch of the present invention includes a bulk single crystal silicon carbide substrate of a first conductivity type having an upper surface and a lower surface. A first epitaxial layer of a second conductivity type silicon carbide is formed upon the upper surface of the substrate. A second epitaxial layer of the second conductivity type silicon carbide is formed on the first epitaxial layer of silicon carbide. A plurality of regions of a third conductivity type silicon carbide are formed in the second epitaxial layer to form a gate grid in the second epitaxial layer. A third epitaxial layer of the second conductivity type silicon carbide is formed on the second epitaxial layer and a fourth epitaxial layer of the second conductivity type silicon carbide is formed upon the third epitaxial layer. The fourth epitaxial layer has a higher doping concentration than is present in the first, second and third epitaxial layers. A first ohmic contact is formed upon the fourth epitaxial layer and a second ohmic contact is formed on the lower surface of the substrate. An ohmic gate contact is connected to the gate grid for pinching off the flow of current between the first ohmic contact and the second ohmic contact when a bias is applied to the ohmic gate contact.

In an alternative embodiment of the present invention, the second epitaxial layer has a lower carrier concentration than the first epitaxial layer. In another alternative embodiment the third epitaxial layer and the first epitaxial layer have substantially the same carrier concentration. In yet another embodiment the third epitaxial layer and the second epitaxial layer have substantially the same carrier concentration.

In another embodiment of the present invention, the field controlled thyristor further comprises a fifth epitaxial layer of a fourth conductivity type formed on the upper surface of the substrate and disposed between the substrate and the first epitaxial layer where the first epitaxial layer is formed on the fifth epitaxial layer.

In a particular embodiment of the field controlled bipolar switch of the present invention, the first conductivity type and the third conductivity type are p-type conductivity and the second conductivity type is n-type conductivity. In such an embodiment, the first ohmic contact is a cathode contact and the second ohmic contact is an anode contact.

In another embodiment of the present invention, the first conductivity type and the third conductivity type are n-type conductivity. The second conductivity type is then p-type conductivity. In such an embodiment the first ohmic contact is an anode contact and the second ohmic contact is a cathode contact.

In an embodiment of the present invention incorporating a tunnel diode, the first and second conductivity types are n-type conductivity and the third and fourth conductivity types are p-type conductivity. In such a device the first ohmic contact is a cathode contact and the second ohmic contact is an anode contact.

In a further aspect of the present invention, the substrate and the first, second, third and fourth epitaxial layers form a mesa having sidewalls which define the periphery of the thyristor. The sidewalls of the mesa may extend downward into the substrate.

In an embodiment of the present invention having sinker anode contacts, regions of the first conductivity type silicon carbide are formed in the substrate at the base of the mesa. Ohmic contacts electrically connected to the second ohmic contact are then formed on the regions of the first conductivity type silicon carbide.

In an alternative mesa embodiment of the present invention, the first, second, third, fourth and fifth epitaxial layers form a mesa. The sidewalls of the mesa define the periphery of the thyristor. The sidewalls of the mesa extend downward through the first, second, third and fourth epitaxial layers and into the fifth epitaxial layer. Optionally, ohmic contacts electrically connected to the second ohmic contact may be formed on the fifth epitaxial layer at the base of the sidewalls of the mesa.

An alternative embodiment of the present invention may also include an insulating layer formed on the sidewalls of the mesa to passivate the sidewalls. Additional embodiments may also be made of 4H polytype silicon carbide.

In a further alternate embodiment of the bipolar switch of the present invention, a plurality of trenches are formed in the third and the fourth epitaxial layers. The plurality of regions of the third conductivity type silicon carbide formed in the second epitaxial layer are at the bottom of the plurality of trenches. The ohmic gate contact is then formed on the third conductivity type silicon carbide formed in the trenches. The flow of current between said first ohmic contact and said second ohmic contact is thereby pinched off when a bias is applied to the ohmic gate contact.

In a further embodiment of the present invention, the gate grid comprises a plurality of connected interdigited fingers. Optionally, the ohmic gate contact comprises a plurality of interdigited fingers formed on the interdigited fingers of the gate grid such that the fingers of the ohmic gate contact are substantially parallel to the fingers of the gate grid. In such a case, the first ohmic contact may comprise a plurality of interdigited fingers formed on the fourth epitaxial layer and interspersed between the fingers of the ohmic gate contact.

In an alternative embodiment of the present invention, a high voltage, high current field control bipolar switch includes a bulk single crystal silicon carbide substrate of a first conductivity type having an upper surface and a lower surface. A first epitaxial layer of a second conductivity type silicon carbide is formed upon the upper surface of the substrate. A plurality of regions of a third conductivity type silicon carbide are formed in the first epitaxial layer to form a gate grid in the first epitaxial layer. Asecond epitaxial layer of the second conductivity type silicon carbide is formed on said the epitaxial layer of silicon carbide. A third epitaxial layer of the second conductivity type silicon carbide upon the second epitaxial layer, The third epitaxial layer has a higher carrier concentration than is present in the first epitaxial layer. A first ohmic contact is formed on the third epitaxial layer and a second ohmic contact is formed on the lower surface of the substrate. An ohmic gate contact connected to the gate grid allows for pinching off the flow of current between the first ohmic contact and the second ohmic contact when a bias is applied to the ohmic gate contact.

A further embodiment of the present invention provides a field controlled bipolar switch wherein the second epitaxial layer and the first epitaxial layer have approximately the same carrier concentration.

A further embodiment of the present invention, a fourth epitaxial layer of a fourth conductivity type is provided. The fourth epitaxial layer is formed on the upper surface of the substrate and disposed between the substrate and the first epitaxial layer. The first epitaxial layer is, therefore, formed on the fourth epitaxial layer.

In a particular embodiment of the present invention the first conductivity type and the third conductivity type are p-type conductivity and the second conductivity type is n-type conductivity. In such a case the first ohmic contact is a cathode contact and the second ohmic contact is an anode contact. In a further embodiment of the present invention the first conductivity type and the third conductivity type are n-type conductivity and the second conductivity type is p-type conductivity. In such a case the first ohmic contact is an anode contact and the second ohmic contact is a cathode contact. In another alternative embodiment of the present invention the first and second conductivity types are n-type conductivity and the third and fourth conductivity types are p-type conductivity. In such a case the first ohmic contact is a cathode contact and the second ohmic contact is an anode contact.

In a further aspect of the present invention, the substrate and the first, second, and third epitaxial layers form a mesa having sidewalls which define the periphery of the thyristor. The sidewalls of the mesa extend downward into the substrate. In a further aspect of the present invention having a mesa, regions of the first conductivity type silicon carbide are formed in the substrate at the base of the mesa. Ohmic contacts electrically connected to the second ohmic contact are formed on the regions of the first conductivity type silicon carbide to provide sinker contacts for the device.

In an embodiment of the present invention having the optional fourth epitaxial layer, the first, second, third and fourth epitaxial layers form a mesa having sidewalls which define the periphery of the thyristor. The sidewalls of the mesa extend downward through the first, second and third epitaxial layers and to or into the fourth epitaxial layer. In a further aspect of such a device, ohmic contacts electrically connected to the second ohmic contact are formed on the fourth epitaxial layer at the base of said sidewalls of the mesa to provide sinker contacts for the device.

In devices having a mesa, an alternative embodiment includes an insulating layer formed on the sidewalls of the mesa to passivate the sidewalls.

An alternative embodiment of the present invention further includes a plurality of trenches formed in the second and the third epitaxial layers. The plurality of regions of the third conductivity type silicon carbide are formed in the first epitaxial layer at the bottom of the plurality of trenches. The ohmic gate contact then comprises an ohmic gate contact formed on the third conductivity type silicon carbide formed in the trenches.

In an alternative embodiment, the gate grid comprises a plurality of connected interdigited fingers. In a further embodiment, the ohmic gate contact comprises a plurality of interdigited fingers formed on the interdigited fingers of the gate grid such that the fingers of the ohmic gate contact are substantially parallel to the fingers of the gate grid. In such a case, the first ohmic contact comprises a plurality of interdigited fingers formed on the third epitaxial layer and interspersed between the fingers of the ohmic gate contact.

An additional alternative embodiment of the present invention provides a high voltage, high current field control bipolar switch which includes a bulk single crystal silicon carbide substrate of a first conductivity type having an upper surface and a lower surface. A first epitaxial layer of a second conductivity type silicon carbide is formed upon the upper surface of the substrate. A second epitaxial layer of the second conductivity type silicon carbide is formed upon the first epitaxial layer. The second epitaxial layer has a higher carrier concentration than is present in the first epitaxial layer. A plurality of trenches are formed through the second epitaxial layer and into the first epitaxial layer. A plurality of regions of a third conductivity type silicon carbide are formed in the first epitaxial layer at the bottom of the plurality of trenches to form a gate grid in the first epitaxial layer. A first ohmic contact is formed upon the second epitaxial layer and a second ohmic contact is formed on the lower surface of the substrate. An ohmic gate contact is formed on the third conductivity type silicon carbide regions in the trenches for pinching off the flow of current between the first ohmic contact and the second ohmic contact when a bias is applied to the ohmic gate contact.

A further embodiment of the present invention includes a third epitaxial layer of a fourth conductivity type silicon carbide formed on the upper surface of the substrate and disposed between the substrate and the first epitaxial layer. The first epitaxial layer is formed on the third epitaxial layer.

In alternative embodiments of the present invention, the first and third conductivity types are p-type conductivity and the second conductivity type is n-type conductivity. Then the first ohmic contact is a cathode contact and the second ohmic contact is an anode contact. Alternatively, the first and third conductivity types are n-type conductivity and the second conductivity type is p-type conductivity. Then the first ohmic contact is an anode contact and the second ohmic contact is a cathode contact. In a tunnel diode alternative embodiment, the first and second conductivity types are n-type conductivity and the third and fourth conductivity types are p-type conductivity. Then the first ohmic contact is a cathode contact and the second ohmic contact is an anode contact.

In a mesa embodiment of the present invention, the substrate and the first and second epitaxial layers form a mesa having sidewalls which define the periphery of said transistor. The sidewalls of the mesa extend downward into the substrate. In a further aspect of the mesa device, an insulating layer is formed on the sidewalls of the mesa to passivate the sidewalls.

In a further aspect of the present invention, the gate grid comprises a plurality of connected interdigited fingers. In an additional interdigited structure of the present invention, the ohmic gate contact comprises a plurality of interdigited fingers formed on the interdigited fingers of the gate grid such that the fingers of the ohmic gate contact are substantially parallel to the fingers of the gate grid. The first ohmic contact then comprises a plurality of interdigited fingers formed on the second epitaxial layer and interspersed between the fingers of the ohmic gate contact.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1A:
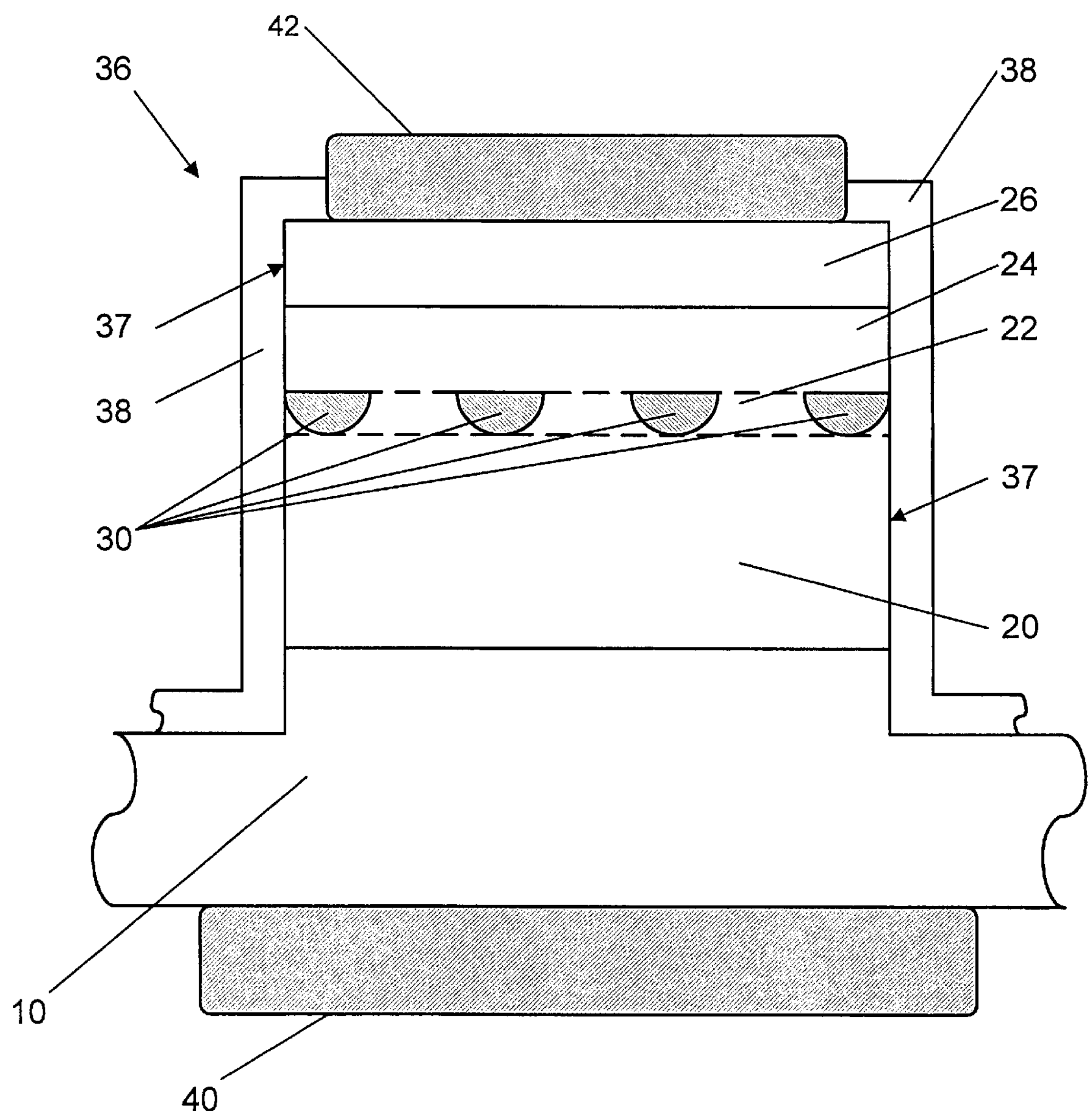
FIG. 1A is a cross-sectional view of one embodiment of the present invention having a buried gate grid.

FIG. 1A illustrates a first embodiment of the high voltage, high current field controlled bipolar switch of the present invention. As seen in FIG. 1A, a bulk single crystal silicon carbide substrate 10 of a first conductivity type having an upper surface and a lower surface has a first epitaxial layer 20 of silicon carbide of a second conductivity type formed on the upper surface of the substrate 10. A second epitaxial layer 22 of silicon carbide of the second conductivity type is formed on the first epitaxial layer 20. Formed within the second epitaxial layer 22 are a plurality of regions of a third conductivity type silicon carbide which form a gate grid 30 in the second epitaxial layer 22. A third epitaxial layer 24 of the second conductivity type silicon carbide is formed on the second epitaxial layer 22. As is also shown in FIG. 1A, a fourth epitaxial layer 26 of the second conductivity type silicon carbide is formed on the third epitaxial layer 24. This fourth epitaxial layer 26 has a higher carrier concentration than is present in either the first epitaxial layer 20, the second epitaxial layer 22 or the third epitaxial layer 24.

Figure 9:
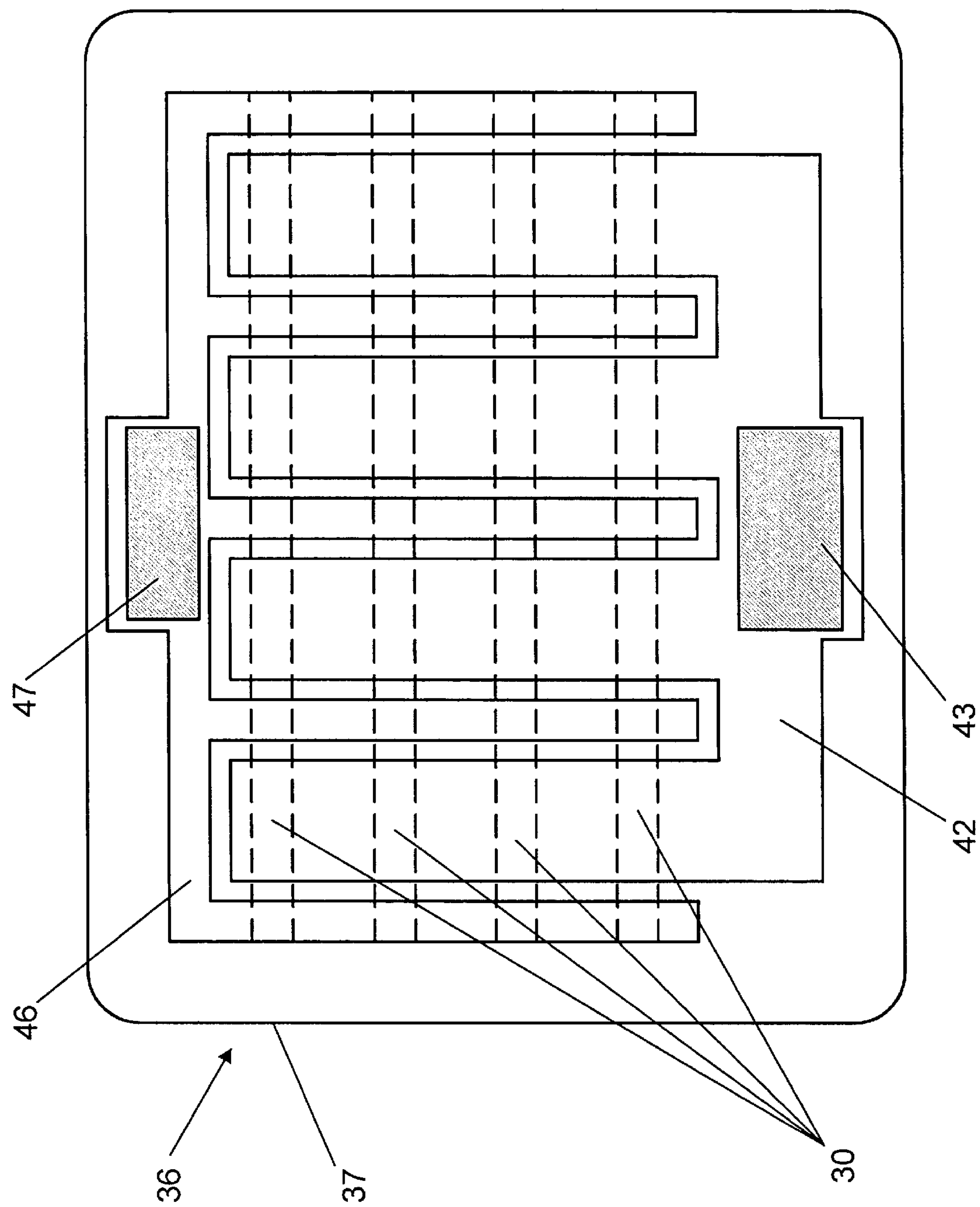
FIG. 9 is plan view of an embodiment of the present invention having a buried gate grid.

A first ohmic contact 42 is formed upon the fourth epitaxial layer and may be either a cathode or an anode contact depending on the conductivity type of the substrate and epitaxial layers. A second ohmic contact 40 is formed on the lower surface of the substrate 10 and also may be either a cathode or an anode. An ohmic gate contact is formed in a third dimension and is illustrated in FIG. 9 as gate contact 46. This ohmic gate contact 46 is formed to contact the plurality of regions 30 formed in the second epitaxial layer 22 so as to pinch off the flow of current between the first ohmic contact 42 and the second ohmic contact 40 when a bias is applied to the ohmic gate contact 46.

As seen in FIG. 1A, the epitaxial structure is optionally formed into a mesa 36 having sidewalls 37 which define the periphery of the bipolar switch. The sidewalls 37 preferably extend through each of the epitaxial layers and into the substrate 10. Optionally, an insulating layer 38 is formed on the sidewalls of the mesa to passivate the sidewalls and may extend onto the exposed areas of silicon carbide of the upper surface of the mesa such as to the first ohmic contact 42 and onto the base of the mesa at the substrate 10.

Figure 1B:
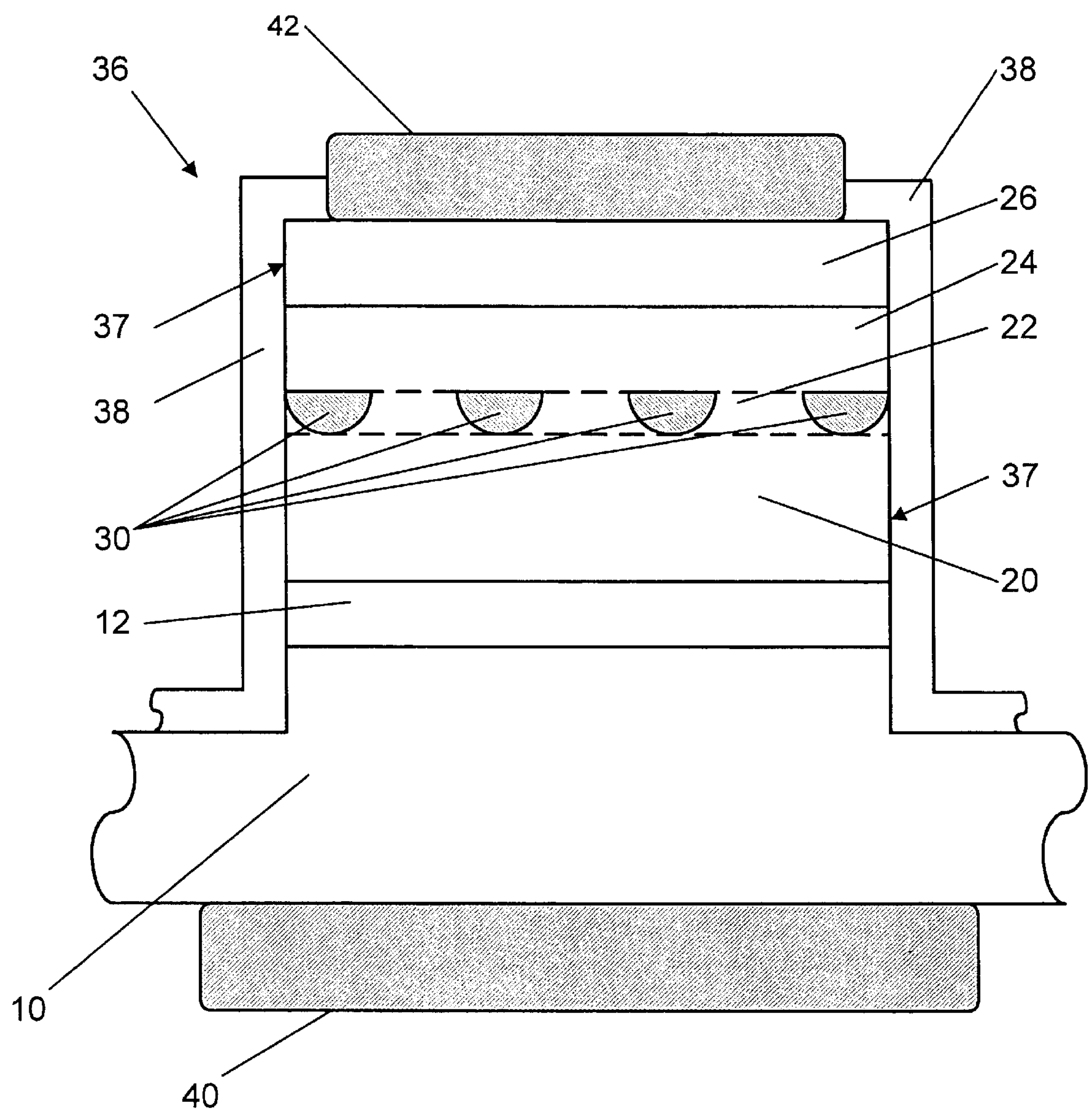
FIG. 1B is a cross-sectional view of an embodiment of the present invention having a buried gate grid and an optional silicon carbide epitaxial layer.

FIG. 1B illustrates an alternative embodiment of the buried gate field controlled thyristor of the present invention. FIG. 1B illustrates an optional fifth epitaxial layer 12 of a fourth conductivity type. The fifth epitaxial layer 12 is formed on the upper surface of the substrate 10 and disposed between the substrate 10 and the first epitaxial layer 20. The first epitaxial layer 20 is, therefore, formed on the fifth epitaxial layer 12.

FIG. 1B also illustrates the epitaxial structure optionally formed into a mesa 36 having sidewalls 37 which define the periphery of the bipolar switch. The sidewalls 37 preferably extend through each of the epitaxial layers and into the substrate 10. Alternatively, the sidewalls 37 of the mesa 36 can extend through the first, second, third and fourth epitaxial layers 20, 22, 24, and 26 and to or into the fifth epitaxial layer 12. The insulating layer 38 may then be formed on the sidewalls of the mesa to passivate the sidewalls and may extend onto the upper surface of the mesa to the first ohmic contact 42 and onto the base of the mesa at the fifth epitaxial layer 12.

The bipolar switch of FIG. 1A may be formed having a p-type conductivity substrate or utilizing an n-type conductivity substrate. In the instance where the substrate 10 is formed of p-type conductivity silicon carbide, the first conductivity type and the third conductivity type are then p-type silicon carbide. The second conductivity type silicon carbide would be n-type silicon carbide. In such an instance, the first epitaxial layer 20, the second epitaxial layer 22, the third epitaxial layer 24 and the fourth epitaxial layer 26 would be n-type conductivity silicon carbide and the substrate 10 and the plurality of regions of the gate grid 30 forming the buried gate would by p-type conductivity silicon carbide. In such a p-n field controlled bipolar switch, the second ohmic contact 40 would be the anode contact and the first ohmic contact 42 would be the cathode contact.

In this embodiment, the gate grid 30 which forms the buried gate of the field controlled bipolar switch and the substrate 10 are preferably formed of $p^+$ type conductivity silicon carbide. As used herein, "$n^+$" or "$p^+$" refer to regions that are defined by higher carrier concentration than are present in adjacent or other regions of the same or another epitaxial layer or substrate. The first epitaxial layer 20 is preferably formed of $n^-$ silicon carbide and the fourth epitaxial layer 26 is preferably formed of $n^+$ silicon carbide. The second epitaxial layer 22 may be formed of lightly doped or $n^-$ silicon carbide which preferably has an even lower carrier concentration than the first epitaxial layer 20. Thus, the plurality of regions of the gate grid 30 which forms the buried gate are preferably formed in the epitaxial layer having the lowest carrier concentration. The third epitaxial layer 24 may have substantially the same carrier concentration as the first epitaxial layer 20 or may have substantially the same carrier concentration as the second epitaxial layer 22.

Figure 5:
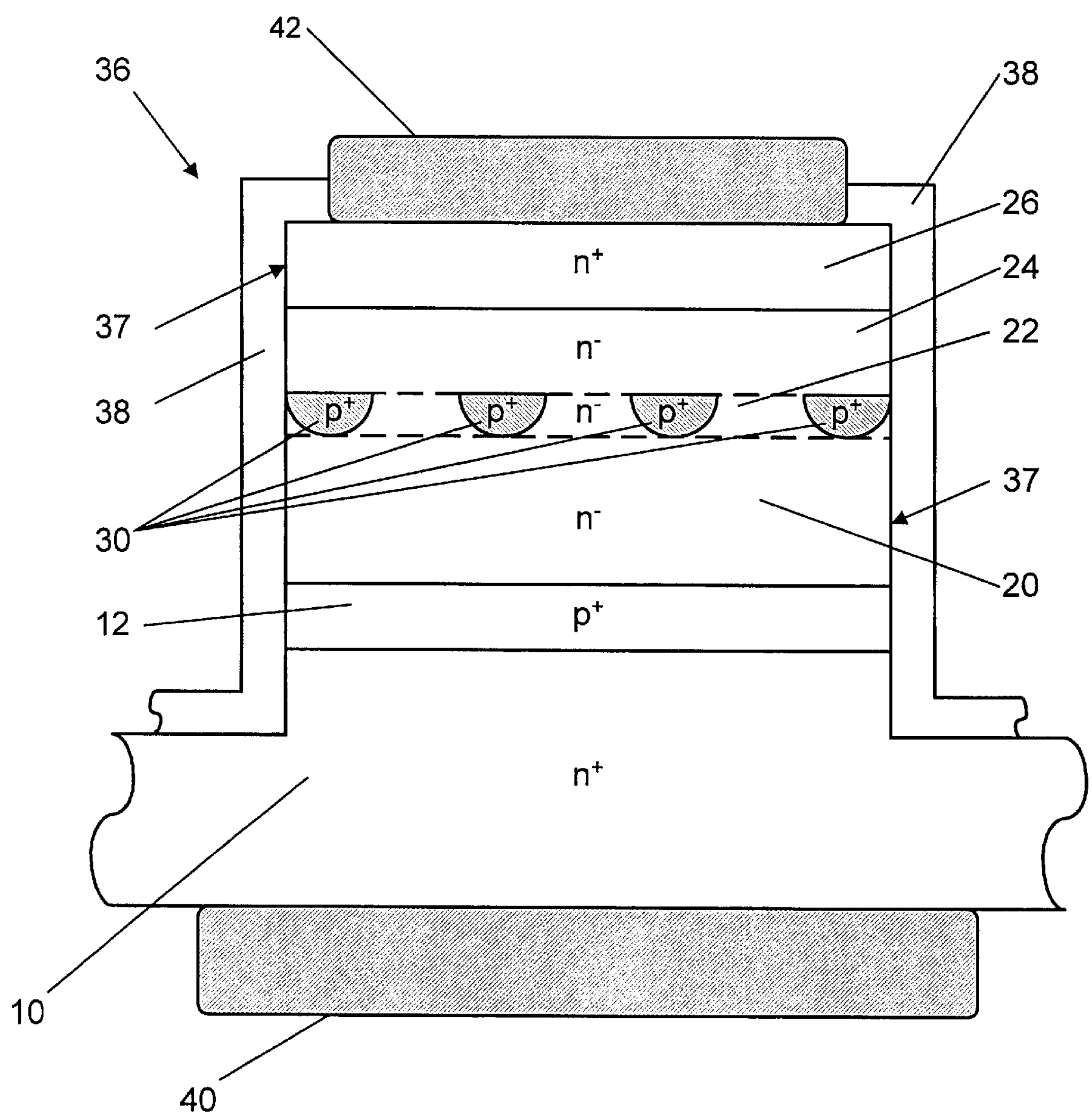
FIG. 5 is a cross-sectional view of a fifth embodiment of the present invention having a buried gate grid and a tunnel diode.

For the device of FIG. 1B the optional fifth epitaxial layer 12 of a fourth conductivity type may be p-type conductivity silicon carbide such as highly doped $p^{n+}$ silicon carbide. Alternatively, a tunnel diode structure may be achieved through utilization of the device of FIG. 1B by making the first conductivity type n-type conductivity silicon carbide such as $n^+$ silicon carbide. In such a device, the substrate 10 and the fifth epitaxial layer 12 form a tunnel diode. This embodiment of the present invention is illustrated in FIG. 5.

The complementary devices to those described above may also be formed by use of an n-type substrate. For the complementary device, the first conductivity type and the third conductivity type are n-type silicon carbide. The second conductivity type silicon carbide would be p-type silicon carbide. Thus, in the complementary device, the first epitaxial layer 20, the second epitaxial layer 22, the third epitaxial layer 24 and the fourth epitaxial layer 26 would be p-type conductivity silicon carbide and the substrate 10 and the plurality of regions of the gate grid 30 forming the buried gate would by n-type conductivity silicon carbide. In this complementary device, the second ohmic contact 40 would be the cathode contact and the first ohmic contact 42 would be the anode contact.

In this complementary embodiment, the plurality of regions of the gate grid 30 which forms the buried gate of the field controlled bipolar switch and the substrate 10 are preferably formed of $n^+$ type conductivity silicon carbide. The first epitaxial layer 20 is preferably formed of $p^-$ silicon carbide and the fourth epitaxial layer 26 is preferably formed of $p^+$ silicon carbide. The second epitaxial layer 22 may be formed of lightly doped or $p^-$ silicon carbide but preferably has an lower carrier concentration than the first epitaxial layer 20. Thus, the plurality of regions of the gate grid 30 which forms the buried gate are preferably formed in the epitaxial layer having the lowest carrier concentration. The third epitaxial layer 24 may have substantially the same carrier concentration as the first epitaxial layer 20 or may have substantially the same carrier concentration as the second epitaxial layer 22.

For the complementary device of FIG. 1B the optional fifth epitaxial layer 12 of a fourth conductivity type may be n-type conductivity silicon carbide such as highly doped $n^+$ silicon carbide.

Figure 2A:
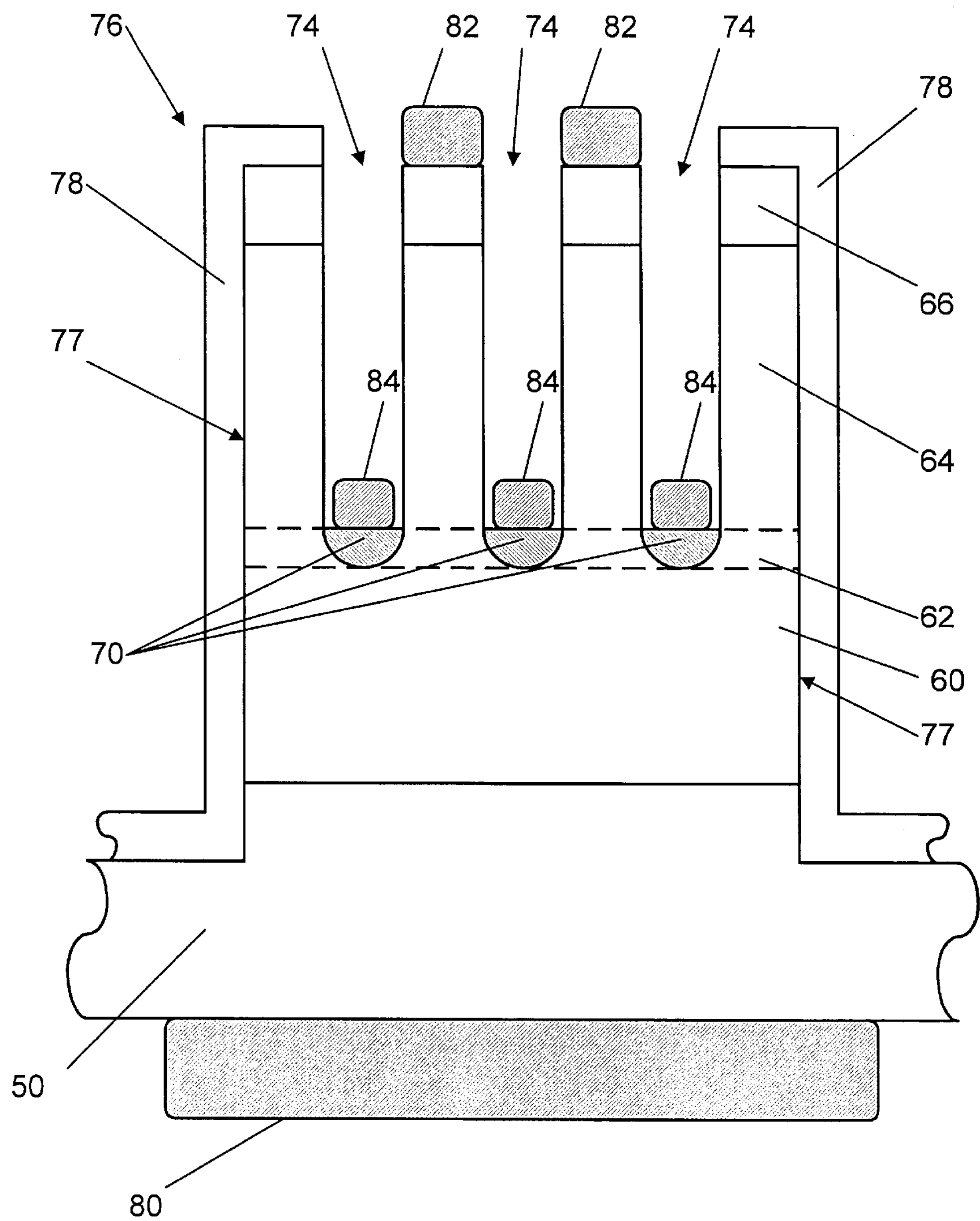
FIG. 2A is a cross-sectional view of a second embodiment of the present invention a gate grid formed in trenches.

FIG. 2A illustrates another embodiment of the high voltage, high current field controlled bipolar switch of the present invention. As seen in FIG. 2A, a bulk single crystal silicon carbide substrate 50 of a first conductivity type having an upper surface and a lower surface has a first epitaxial layer 60 of silicon carbide of a second conductivity type formed on the upper surface of the substrate 50. The second epitaxial layer 62 of silicon carbide of the second conductivity type is formed on the first epitaxial layer 60. A third epitaxial layer 64 of the second conductivity type silicon carbide is formed on the second epitaxial layer 62. As is also shown in FIG. 2A, a fourth epitaxial layer 66 of the second conductivity type silicon carbide is formed on the third epitaxial layer 64. This fourth epitaxial layer 66 has a higher carrier concentration than is present in the first epitaxial layer 60, the second epitaxial layer 62 or the third epitaxial layer 64. A plurality of trenches 74 are formed in the third and fourth epitaxial layers 64 and 66. A plurality of regions of a third conductivity type silicon carbide which form a gate grid 70 in the second epitaxial layer 62 are formed at the bottom of the plurality of trenches 74.

As seen in FIG. 2A, the first ohmic contact 82 is formed upon the fourth epitaxial layer and may be either a cathode or an anode contact. A second ohmic contact 80 is formed on the lower surface of the substrate 50 and also may be either a cathode or an anode. An ohmic gate contact is formed as a gate contact 84. The ohmic gate contact 84 is formed on the plurality of regions of the gate grid 70 formed in the bottom of the trenches 74. This ohmic gate contact 84 is formed to contact the plurality of regions of the gate grid 70 formed in the second epitaxial layer 62 so as to pinch off the flow of current between the first ohmic contact 82 and the second ohmic contact 80 when a bias is applied to the ohmic gate contact 84.

Also shown in FIG. 2A the epitaxial structure is optionally formed into a mesa 76 having sidewalls 77 which define the periphery of the bipolar switch. The sidewalls 77 preferably extend through each of the epitaxial layers and into the substrate 50. Optionally, an insulating layer 78 is formed on the sidewalls of the mesa to passivate the sidewalls and may extend onto the exposed areas of silicon carbide of the upper surface of the mesa such as to the first ohmic contact 82 and onto the exposed areas of silicon carbide at the base of the mesa at the substrate 50.

Figure 2B:
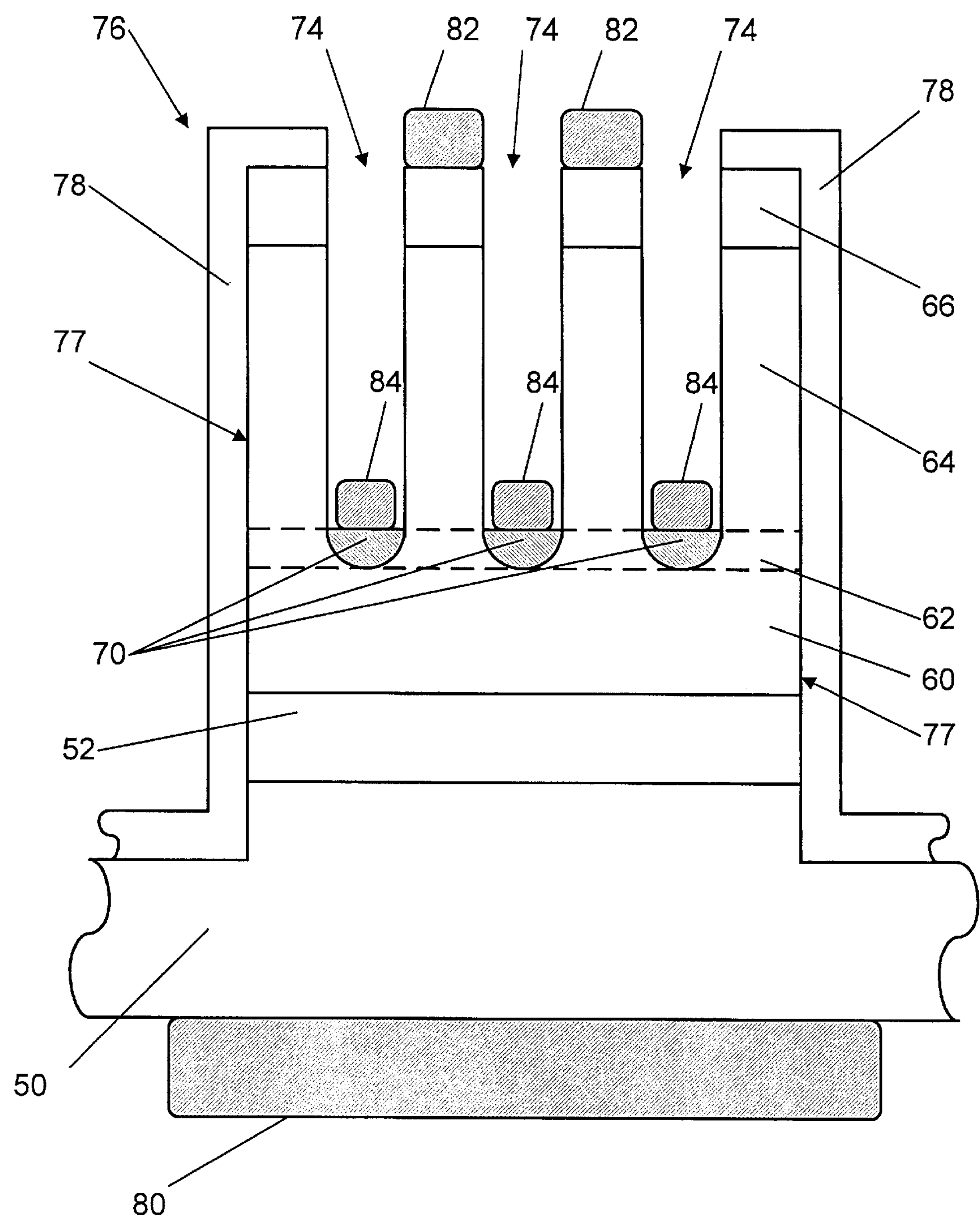
FIG. 2B is a cross-sectional view of an embodiment of the present invention having a gate grid formed in trenches and an optional silicon carbide epitaxial layer.

FIG. 2B illustrates an alternative embodiment of the buried gate field controlled bipolar switch of the present invention. FIG. 2B illustrates an optional fifth epitaxial layer 52 of a fourth conductivity type. The fifth epitaxial layer 52 is formed on the upper surface of the substrate 50 and disposed between the substrate 50 and the first epitaxial layer 60. The first epitaxial layer 60 is, therefore, formed on the fifth epitaxial layer 52.

FIG. 2B also illustrates the epitaxial structure optionally formed into a mesa 76 having sidewalls 77 which define the periphery of the bipolar switch. The sidewalls 77 preferably extend through each of the epitaxial layers and into the substrate 50. Alternatively, the sidewalls 77 of the mesa 76 can extend through the first, second, third and fourth epitaxial layers 60, 62, 64, and 66 and to or into the fifth epitaxial layer 52. The insulating layer 78 may then be formed on the sidewalls of the mesa to passivate the sidewalls and may extend onto the upper surface of the mesa and onto the base of the mesa.

The bipolar switch of FIG. 2A may be formed having a p-type conductivity substrate or utilizing an n-type conductivity substrate. In the instance where the substrate 50 is formed of p-type conductivity silicon carbide, the first conductivity type and the third conductivity type are then p-type silicon carbide. The second conductivity type silicon carbide would be n-type silicon carbide. In such an instance, the first epitaxial layer 60, the second epitaxial layer 62, the third epitaxial layer 64 and the fourth epitaxial layer 66 would be n-type conductivity silicon carbide and the substrate 50 and the plurality of regions 70 forming the buried gate would by p-type conductivity silicon carbide. In such a p-n field controlled bipolar switch, the second ohmic contact 80 would be the anode contact and the first ohmic contact 82 would be the cathode contact.

In such a p-type substrate embodiment, the plurality of regions of the gate grid 70 which form the buried gate of the field controlled bipolar switch and the substrate 50 are preferably formed of $p^+$ silicon carbide. The first epitaxial layer 60 is preferably formed of $n^-$ silicon carbide and the fourth epitaxial layer 66 is preferably formed of $n^+$ silicon carbide. The second epitaxial layer 62 may be formed of lightly doped or $n^-$ silicon carbide but preferably has an even lower carrier concentration than the first epitaxial layer 60. Thus, the plurality of regions 70 which form the buried gate are preferably formed in the epitaxial layer having the lowest carrier concentration. The third epitaxial layer 64 may have substantially the same carrier concentration as the first epitaxial layer 60 or may have substantially the same carrier concentration as the second epitaxial layer 62.

Figure 6:
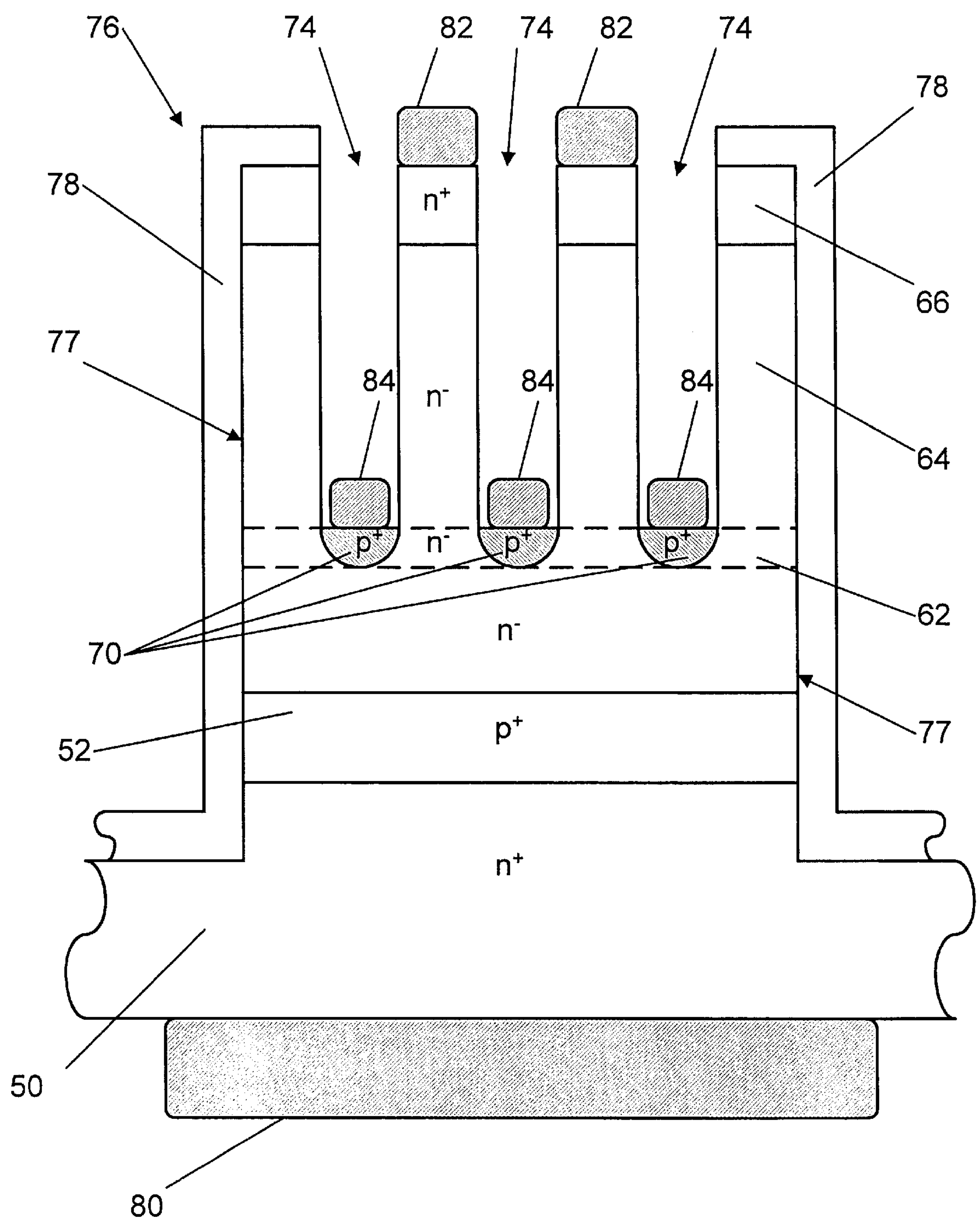
FIG. 6 is a cross-sectional view of a sixth embodiment of the present invention having a tunnel diode and a gate grid formed in trenches.

For the device of FIG. 2B the optional fifth epitaxial layer 52 of a fourth conductivity type may be p-type conductivity silicon carbide such as highly doped $p^+$ silicon carbide. Alternatively, a tunnel diode structure may be achieved through utilization of the device of FIG. 2B by making the first conductivity type n-type conductivity silicon carbide such as $n^+$ silicon carbide. Thus, the substrate 50 and the fifth epitaxial layer 52 form a tunnel diode. This embodiment of the present invention is illustrated in FIG. 6.

Complementary devices may also be formed on an n-type substrate. For the complementary devices, the first conductivity type and the third conductivity type are n-type silicon carbide. The second conductivity type silicon carbide would be p-type silicon carbide. Thus, in the complementary device, the first epitaxial layer 60, the second epitaxial layer 62, the third epitaxial layer 64 and the fourth epitaxial layer 66 would be p-type conductivity silicon carbide and the substrate 50 and the plurality of regions 70 forming the buried gate would by n-type conductivity silicon carbide. In this complementary device, the second ohmic contact 80 would be the cathode contact and the first ohmic contact 82 would be the anode contact.

In the complementary embodiment of the device of FIG. 2A, the plurality of regions 70 which form the buried gate of the field controlled bipolar switch and the substrate 50 are preferably formed of $n^+$ type conductivity silicon carbide. The first epitaxial layer 60 is preferably formed of $p^-$ silicon carbide and the fourth epitaxial layer 66 is preferably formed of $p^+$ silicon carbide. The second epitaxial layer 62 may be formed of lightly doped or $p^-$ silicon carbide but preferably has a lower carrier concentration than the first epitaxial layer 60. Thus, the plurality of regions 70 which form the buried gate are preferably formed in the epitaxial layer having the lowest carrier concentration. The third epitaxial layer 64 may have substantially the same carrier concentration as the first epitaxial layer 60 or may have substantially the same carrier concentration as the second epitaxial layer 62.

For the complementary device of FIG. 2B the optional fifth epitaxial layer 52 of a fourth conductivity type may be n-type conductivity silicon carbide such as highly doped $n^+$ silicon carbide.

Figure 3:
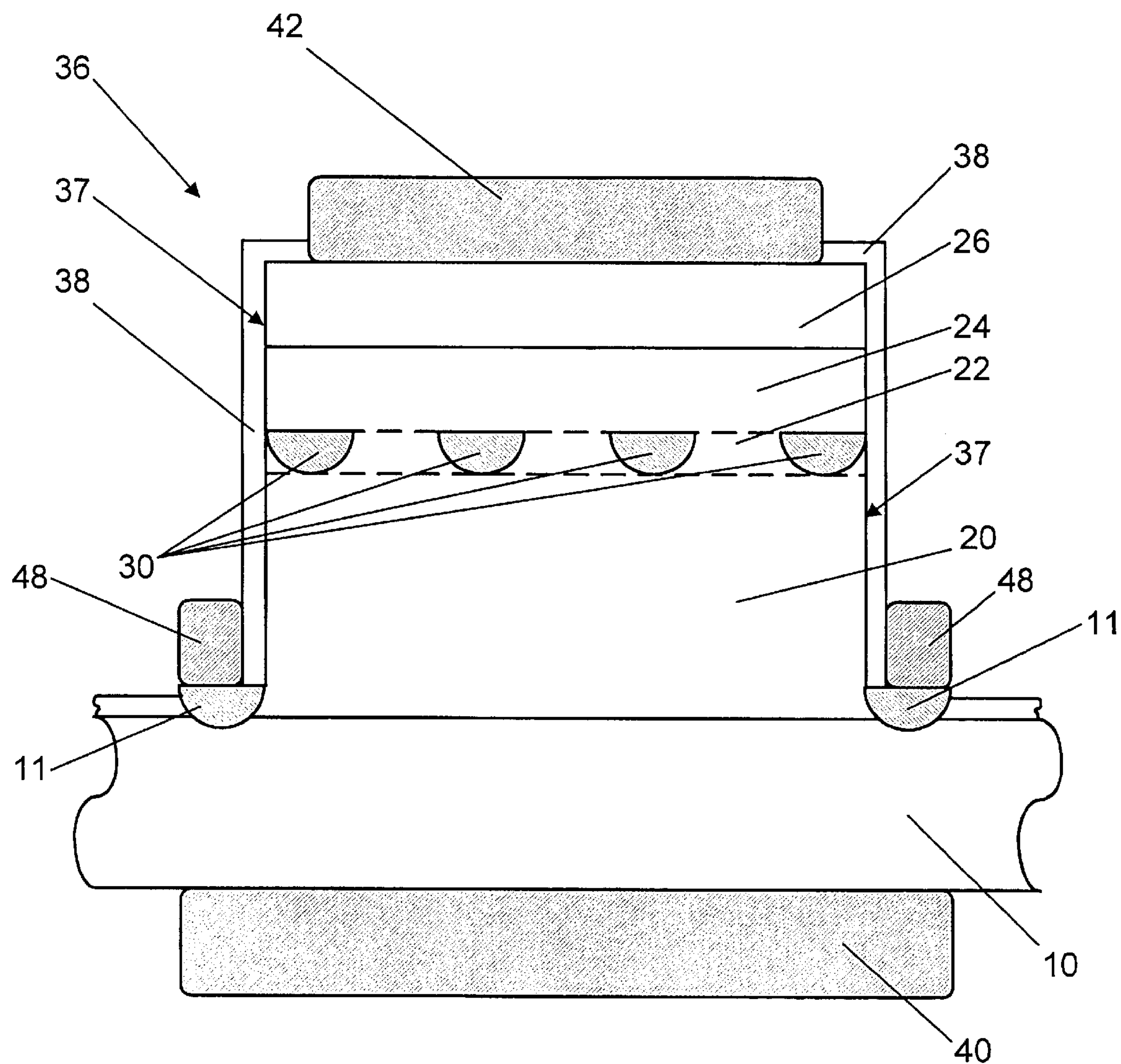
FIG. 3 is a cross-sectional view of a third embodiment of the present invention having anode sinker contacts and a buried gate grid.

FIG. 3 illustrates an additional embodiment of the present invention having a sinker contact. As seen in FIG. 3, the device of FIG. 1A has regions 11 of the first conductivity type silicon carbide formed in the substrate 10 at the base of the mesa 36. Formed on the regions 11 of the first conductivity type silicon carbide are ohmic contacts 48 which are electrically connected to the second ohmic contact 40. The device of FIG. 3 may be produced in each of the various combinations of conductivity types described for the device of FIG. 1A. The regions 11 are formed of the same conductivity type as the substrate 10 and have a high carrier concentration. Thus, for example with a p-type substrate, regions 11 would be $p^+$ silicon carbide and with an n-type conductivity substrate the regions 11 would be $n^+$ silicon carbide.

A sinker contact may also be formed with a device having the optional fifth epitaxial layer 12 of FIG. 1B. In such a case, the mesa is formed as described above and extends to or into the fifth epitaxial layer 12 but does not extend into the substrate 10. Ohmic contacts would then be formed on the fifth epitaxial layer 12 at the base of the sidewalls 37 of the mesa 36.

Figure 4:
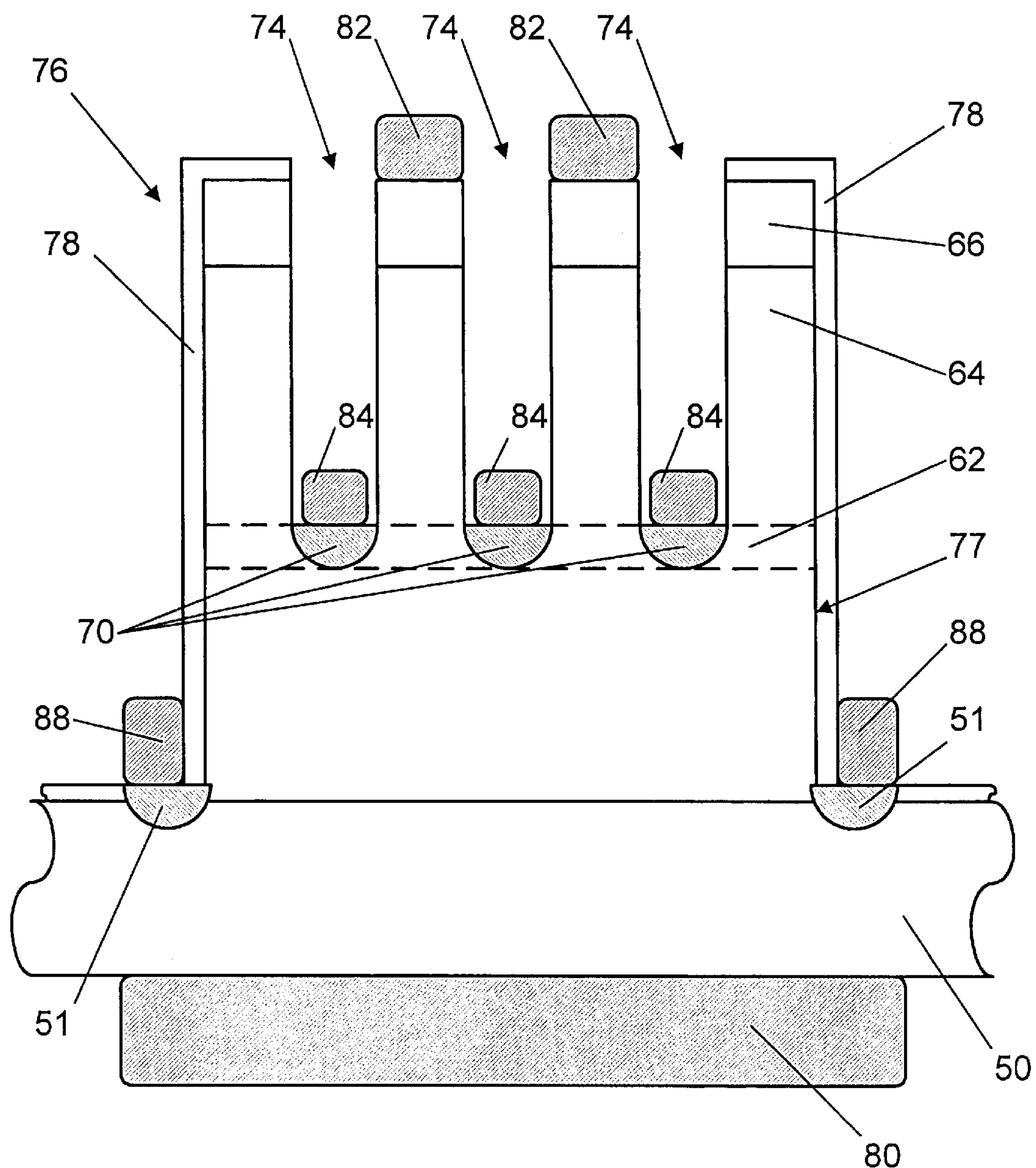
FIG. 4 is a cross-sectional view of a fourth embodiment of the present invention having anode sinker contacts and a gate grid formed in trenches.

FIG. 4 illustrates an additional embodiment of the present invention having a sinker contact. As seen in FIG. 4, the device of FIG. 2A has regions 51 of the first conductivity type silicon carbide formed in the substrate 50 at the base of the mesa 76. Formed on the regions 51 of the first conductivity type silicon carbide are ohmic contacts 88 which are electrically connected to the second ohmic contact 80. The device of FIG. 4 may be produced in each of the various combinations of conductivity types described for the device of FIG. 2A. The regions 51 are formed of the same conductivity type as the substrate 50 and have a high carrier concentration. Thus, for example with a p-type substrate, regions 51 would be $p^+$ silicon carbide and with an n-type conductivity substrate the regions 51 would be $n^+$ silicon carbide.

A sinker contact may also be formed with a device having the optional fifth epitaxial layer 52 of FIG. 2B. In such a case, the mesa is formed as described above and extends to or into the fifth epitaxial layer 52 but does not extend into the substrate 50. Ohmic contacts would then be formed on the fifth epitaxial layer 52 at the base of the sidewalls 77 of the mesa 76.

Figure 7:
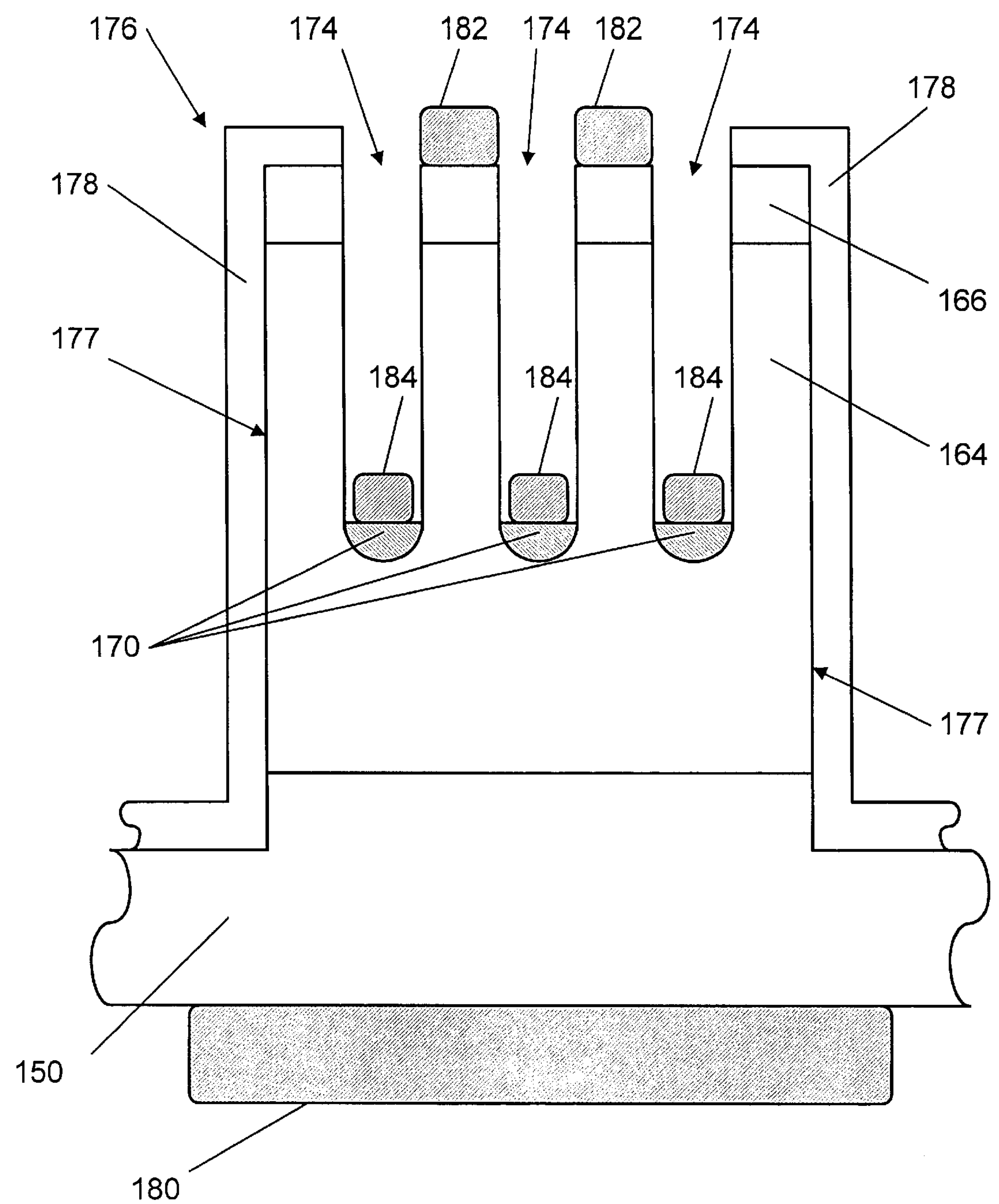
FIG. 7 is a cross-sectional view of a seventh embodiment of the present invention having a gate grid formed in trenches.

FIG. 7 illustrates another embodiment of the present invention. As seen in FIG. 7, as with the device of FIG. 2A a bulk single crystal silicon carbide substrate 150 of a first conductivity type having an upper surface and a lower surface has a first epitaxial layer 164 of silicon carbide of a second conductivity type formed on the upper surface of the substrate 150. As is also shown in FIG. 7, a second epitaxial layer 166 of the second conductivity type silicon carbide is formed on the first epitaxial layer 164. This second epitaxial layer 166 has a higher carrier concentration than is present in the first epitaxial layer 164. A plurality of trenches 174 are formed in the first and second epitaxial layers 164 and 166. A plurality of regions of a third conductivity type silicon carbide which form a gate grid 170 in the first epitaxial layer 164 are formed at the bottom of the plurality of trenches 174.

As seen in FIG. 7, a first ohmic contact 182 is formed upon the second epitaxial layer 166 and may be either a cathode or an anode contact. A second ohmic contact 180 is formed on the lower surface of the substrate 150 and also may be either a cathode or an anode. An ohmic contact is formed as a gate contact 184. The ohmic gate contact 184 is formed on the plurality of regions of the gate grid 170 formed in the bottom of the trenches 174. This ohmic gate contact 184 is formed to contact the plurality of regions of the gate grid 170 formed in the first epitaxial layer 164 so as to pinch off the flow of current between the first ohmic contact 182 and the second ohmic contact 180 when a bias is applied to the ohmic gate contact 184 Also shown in FIG. 7 the epitaxial structure is optionally formed into a mesa 176 having sidewalls 177 which define the periphery of the bipolar switch. The sidewalls 177 preferably extend through each of the epitaxial layers and into the substrate 150. Optionally, an insulating layer 178 is formed on the sidewalls of the mesa to passivate the sidewalls and may extend onto the exposed areas of silicon carbide on the upper surface of the mesa such as to the first ohmic contact 182 and onto the exposed areas of silicon carbide at the base of the mesa at the substrate 150.

Figure 8:
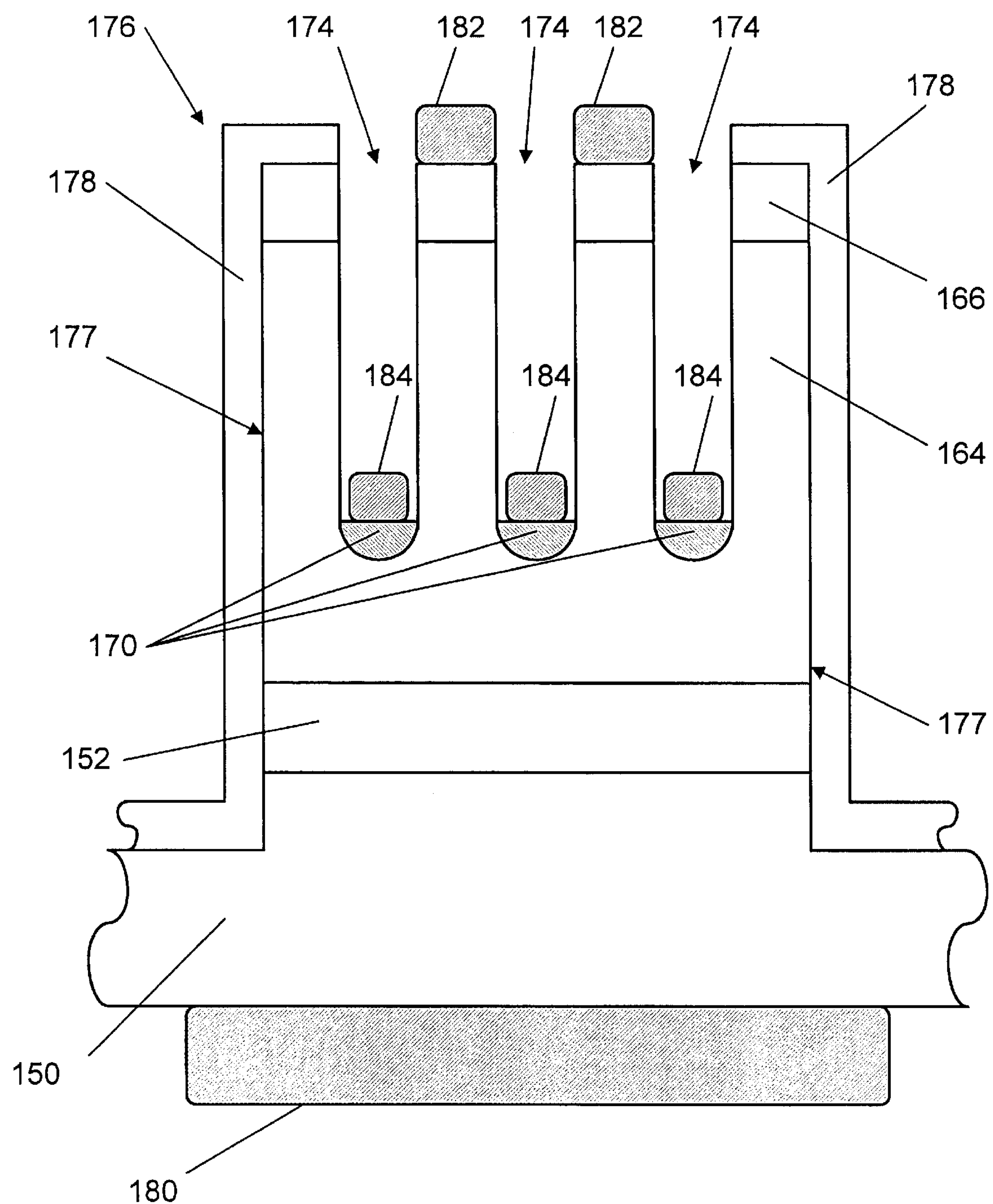
FIG. 8 is a cross-sectional view of an eighth embodiment of the present invention having a gate grid formed in trenches.

FIG. 8 illustrates an alternative embodiment of the field controlled bipolar switch of the present invention. FIG. 8 illustrates an optional third epitaxial layer 152 of a fourth conductivity type. The third epitaxial layer 152 is formed on the upper surface of the substrate 150 and disposed between the substrate 150 and the first epitaxial layer 164. The first epitaxial layer 164 is, therefore, formed on the third epitaxial layer 152.

FIG. 8 also illustrates the epitaxial structure optionally formed into a mesa 176 having sidewalls 177 which defines the periphery of the thyristor. The sidewalls 177 preferably extend through each of the epitaxial layers and into the substrate 150. Alternatively, the sidewalls 177 of the mesa 176 can extend through the first and second epitaxial layers 164, and 166 and to or into the third epitaxial layer 152. The insulating layer 178 may then be formed on the sidewalls of the mesa to passivate the sidewalls and may extend onto the exposed areas of silicon carbide on the upper surface of the mesa such as to the first ohmic contact 182 and onto the exposed areas of silicon carbide at the base of the mesa at the third epitaxial layer 152.

The bipolar switch of FIG. 7 may be formed having a p-type conductivity substrate or utilizing an n-type conductivity substrate. In the instance where the substrate 150 is formed of p-type conductivity silicon carbide, the first conductivity type and the third conductivity type are then p-type silicon carbide. The second conductivity type silicon carbide would be n-type silicon carbide. In such an instance, the first epitaxial layer 164 and the second epitaxial layer 166 are n-type conductivity silicon carbide and the substrate 150 and the plurality of regions 170 forming the buried gate are p-type conductivity silicon carbide. In such a p-n field controlled thyristor, the second ohmic contact 180 is the anode contact and the first ohmic contact 182 is the cathode contact.

In this embodiment, the plurality of regions of the gate grid 170 which form the buried gate of the field controlled bipolar switch and the substrate 150 are preferably formed of $p^+$ type conductivity silicon carbide. The first epitaxial layer 164 is preferably formed of $n^-$ silicon carbide and the second epitaxial layer 166 is preferably formed of $n^+$ silicon carbide.

For the device of FIG. 8, the optional third epitaxial layer 152 of a fourth conductivity type may be p-type conductivity silicon carbide such as highly doped $p^+$ silicon carbide. Alternatively, a tunnel diode structure may be achieved through utilization of the device of FIG. 8 by making the first conductivity type n-type conductivity silicon carbide such as $n^+$ silicon carbide. In such a device, the substrate 150 and the third epitaxial layer 152 form a tunnel diode.

The complementary device may also be formed on an n-type substrate. For the complementary device, the first conductivity type and the third conductivity type are n-type silicon carbide. The second conductivity type silicon carbide would then be p-type silicon carbide. Thus, in the complementary device, the first epitaxial layer 164 and the second epitaxial layer 166 are p-type conductivity silicon carbide and the substrate 150 and the plurality of regions 170 forming the buried gate are n-type conductivity silicon carbide. In this complementary device, the second ohmic contact 180 is the cathode contact and the first ohmic contact 182 is the anode contact.

In the complementary embodiment of the device of FIG. 8, the plurality of regions 170 which form the buried gate of the field controlled bipolar switch and the substrate 150 are preferably formed of $n^+$ type conductivity silicon carbide. The first epitaxial layer 164 is preferably formed of $p^-$ silicon carbide and the second epitaxial layer 166 is preferably formed of $p^+$ silicon carbide. For the complementary device of FIG. 8 the optional third epitaxial layer 152 of a fourth conductivity type may be n-type conductivity silicon carbide such as $n^+$ silicon carbide.

A plan view of the devices according to FIGS. 1A, 1B, 3 and 5 is shown in FIG. 9. As seen in FIG. 9, the bipolar switch of the present invention is formed as a mesa 36 having sidewalls 37. The buried gate grid 30, which is illustrated as the hidden lines of FIG. 9, extends perpendicular to the gate contact 46 which interconnects the gate grid 30 to create a plurality of connected parallel fingers. The plurality of fingers of the gate contact 46 are formed in trenches which extend downward to the upper surface of the buried gate grid 30 to allow contact to the buried gate grid 30. Also shown in FIG. 9 is a contact pad 47 which may be formed on the gate contact 46 to facilitate interconnection of the device according to the present invention. FIG. 9 also illustrates the first ohmic contact 42 which may also form a plurality of fingers. The fingers of the first ohmic contact 42 may be interdigited with the fingers of the gate contact 46. A contact pad 43 may also be formed on the first ohmic contact 42 to facilitate interconnection of the device of FIG. 9. For the device of FIG. 3, the contact 46 (not shown in FIG. 9) formed at the base of the mesa 36 would be formed ringing the mesa 36 shown in FIG. 9.

Figure 10:
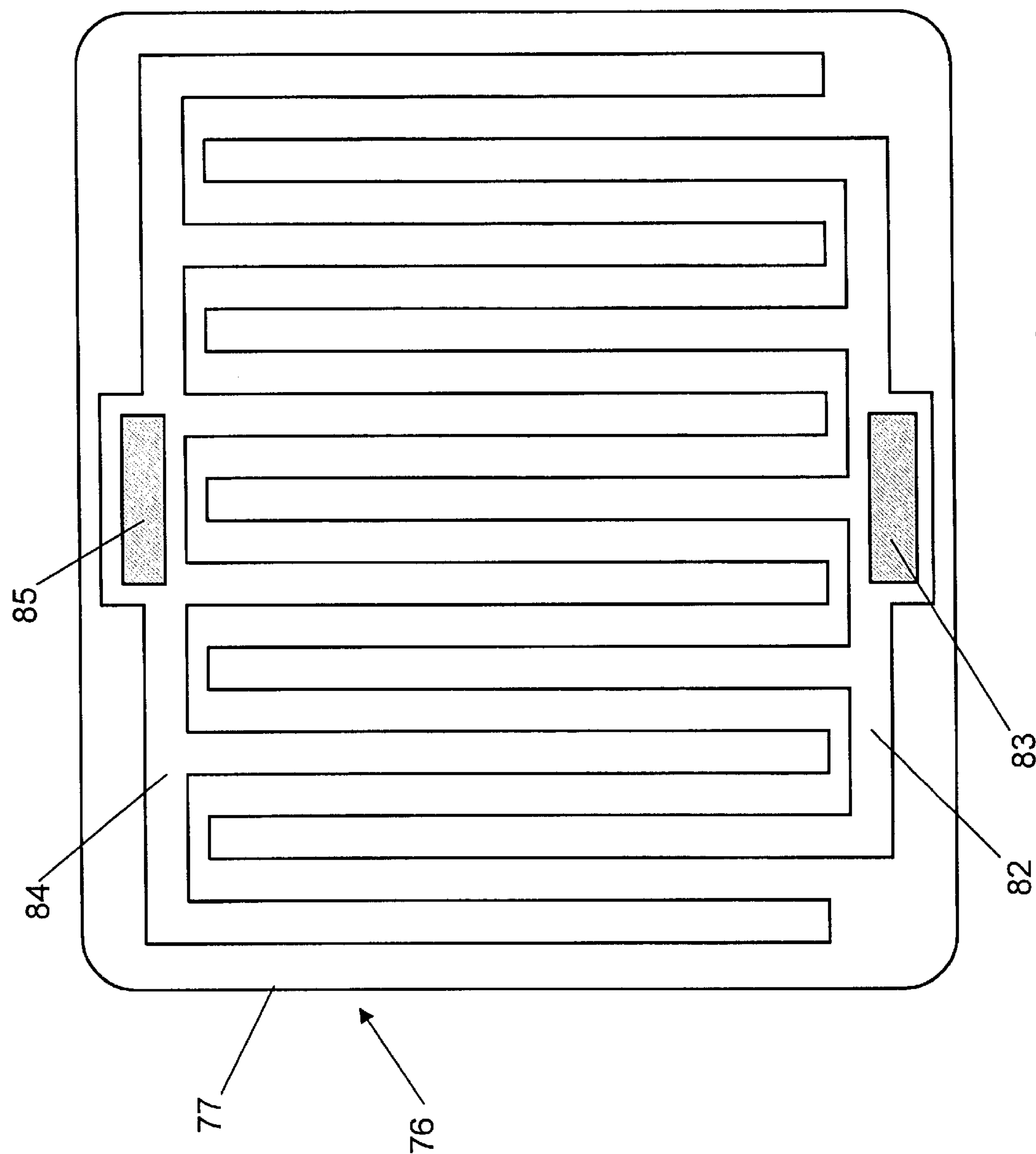
FIG. 10 is a plan view of an alternative embodiment of the present invention having a gate formed in trenches.

A plan view of the devices according to FIGS. 2A, 2B, 4, 6, 7 and 8 is shown in FIG. 10. In FIG. 10, the element labelled as 76 corresponds to previously numbered elements 76 and 176, the element labelled as 77 corresponds to previously numbered elements 77 and 177, the element labelled as 82 corresponds to previously numbered elements 82 and 182, and the element labelled as 84 corresponds to previously numbered elements 84 and 184. As seen in FIG. 10, the bipolar switch of the present invention is formed as a mesa 76, 176 having sidewalls 77, 177. The gate grid 70, 170 extends parallel to the gate contact 84, 184 which interconnects the gate grid 70, 170 to create a plurality of connected parallel fingers. The plurality of fingers of the gate contact 84, 184 are formed in the trenches 74, 174 and allow contact to the gate grid 70, 170. Also shown in FIG. 10 is a contact pad 85 which may be formed on the gate contact 84, 184 to facilitate interconnection of the device according to the present invention.

FIG. 10 also illustrates the first ohmic contact 82, 182 which may form a plurality of fingers. The fingers of the first ohmic contact 82, 182 may be interdigited with the fingers of the gate contact 84, 184. In such a case, the ohmic gate contact 84, 184 comprises a plurality of interdigited fingers formed on the interdigited fingers of the gate grid 70, 170 such that the fingers of the ohmic gate contact 84, 184 are substantially parallel to the fingers of the gate grid. The first ohmic contact 82, 182 would then comprise a plurality of interdigited fingers formed on the upper most epitaxial layer and be interspersed between the fingers of the ohmic gate contact 84, 184. A contact pad 83 may also be formed on the first ohmic contact 82, 182 to facilitate interconnection of the device of FIG. 10. For the device of FIG. 4, the contact 86 (not shown in FIG. 10) formed at the base of the mesa 76 would be formed ringing the mesa 76 shown in FIG. 10.

In each of the embodiments described above, the substrate and epitaxial layer may be formed of silicon carbide selected from the group of 6H, 4H, 15R or 3C silicon carbide, however, 4H silicon carbide is preferred for each of the devices described above. The preferred metals for contact to n-type epitaxial layers or substrates is nickel (Ni). Platinum or nickel are suitable for forming ohmic contacts to p-type epitaxial layers or substrates. Aluminum tie contacts may also be used to form the ohmic contacts of the present invention. While these particular metals have been described, any other metals known to those of skill in the art which form ohmic contacts with silicon carbide may be used.

The fabrication of the devices described above with respect to FIGS. 1A through 10 will now be described. In fabricating the device of FIG. 1A having a $p^+$ substrate 10, a thick $n^-$ layer 20 is grown on the $p^+$ substrate 10 utilizing an epitaxial growth process such as that described in U.S. Pat. No. 4,912,064, the disclosure of which is incorporated herein by reference as if set forth fully. The anode contact 40 is formed on the bottom of the substrate 10 by forming an ohmic contact with the $p^+$ substrate. A second $n^-$ epitaxial layer 22 is also epitaxially grown on the first $n^-$ epitaxial layer 20. This second epitaxial layer 22 may have a lower carrier concentration than the first epitaxial layer 20 or it may have the same carrier concentration as the first epitaxial layer 20 in which case it may be formed as a part of the first epitaxial layer 20. In either case, a deep $p^+$ implanted gate grid is then formed in the second epitaxial layer 22 by methods such as those described in U.S. Pat. No. 5,087,576, the disclosure of which is incorporated herein as if set forth fully. After creating the $p^+$ gate grid 30 in the second epitaxial layer 22, a third $n^-$ epitaxial layer 24 is epitaxially grown on the second epitaxial layer 22. This third epitaxial layer 24 may have approximately the same carrier concentration as either the first epitaxial layer 20 or the second epitaxial layer 22 and may be created using the same epitaxial growth process described above. After growing the third epitaxial layer 24, a fourth epitaxial layer 26 is grown on the third epitaxial layer 24 utilizing the above epitaxial growth method. This fourth epitaxial layer 26 is a highly doped $n^+$ epitaxial layer which facilitates a good top cathode ohmic contact.

After growing all of the epitaxial layers, gate contacts are formed by reactive ion etching through the third and fourth epitaxial layers 24 and 26 and to the $p^+$ gate grid 30. For the buried gate grid device of FIG. 1A, the gate grid 30 is contacted by etching a plurality of trenches which are perpendicular to the direction of the gate grid and then forming ohmic contacts in the bottom of these trenches. These trenches may be formed utilizing the reactive ion etching techniques described in U.S. Pat. No. 4,981,551, the disclosure of which is incorporated herein by reference as if set forth fully. After the device is etched to expose portions of the gate grid, ohmic contacts may be formed for the cathode and the gate grid where the gate grid contacts are formed in the bottom of the trenches created by the etching process and the cathode contact 42 is formed on the fourth epitaxial layer 26.

The area around the device is etched to form a mesa. The mesa preferably extends past the depletion region of the device to confine current flow in the device to the mesa and reduce the capacitance of the device. If the depletion region of the device extends below the level of the mesa then it spreads to areas outside the mesa, resulting in larger capacitance. The mesa is preferably formed by reactive ion etching around the above described device, however other methods of forming known to one skilled in the art may be used to form the mesa. After formation of the mesa, an insulating layer 78 of, for example, silicon dioxide, may be formed over the exposed surfaces of the device, including the sidewalls of the mesa, to passivate the device. While $SiO_2$ is preferred as the insulating material, other insulating materials known to those of skill in the art may be utilized.

The device of FIG. 1B may be created by carrying out the above steps but including forming an epitaxial layer 12 of $p^+$ silicon carbide on the substrate 10 prior to formation of the first epitaxial layer 20. The device of FIG. 3 may be formed by creating the device of FIG. 1A and, prior to creation of the insulating layer, forming regions of $p^+$ silicon carbide 11 at the base of the mesa. An ohmic contact 48 can then be formed on these regions to create a sinker anode. Furthermore, the device of FIG. 1B may be modified to include a sinker anode by only etching the mesa to the $p^+$ layer 12 and then forming an ohmic contact at the base of the mesa. The complementary devices of those described above with reference to FIGS. 1A, 1B and 3 may be created by utilizing the above described method but by substituting $n^+$ silicon carbide for $p^+$ silicon carbide, $p^-$ silicon carbide for $n^-$ silicon carbide and $p^+$ silicon carbide for $n^+$ silicon carbide.

In fabricating the device of FIG. 2A having a $p^+$ substrate 50, a thick $n^-$ layer 60 is grown on the $p^+$ substrate 50 utilizing an epitaxial growth process such as that described in U.S. Pat. No. 4,912,064, the disclosure of which is incorporated herein by reference as if set forth fully. The anode contact 80 is formed on the bottom of the substrate 50 by forming an ohmic contact with the $p^+$ substrate. A second $n^-$ epitaxial layer 62 is also formed on the first $n^-$ epitaxial layer 60. This second epitaxial layer 62 may have a lower carrier concentration than the first epitaxial layer 60 or it may have the same carrier concentration as the first epitaxial layer 60 in which case it may be formed as a part of the first epitaxial layer 60. A third $n^-$ epitaxial layer 64 is also grown on the second epitaxial layer 62. This third epitaxial layer 64 may have approximately the same carrier concentration as either the first epitaxial layer 60 or the second epitaxial layer 62 and may be created using the same epitaxial growth process described above. After growing the third epitaxial layer 64, a fourth epitaxial layer 66 is grown on the third epitaxial layer 64 utilizing the above epitaxial growth method. This fourth epitaxial layer 66 is a highly doped $n^+$ epitaxial layer which facilitates a good top cathode ohmic contact.

After growing all of the epitaxial layers, trenches are etched through the third epitaxial layer 66 and the fourth epitaxial layer 64. These trenches may be formed utilizing the reactive ion etching techniques described above with respect to U.S. Pat. No. 4,981,551. After forming the trenches, $p^+$ gate regions are formed at the base of the trenches in the second epitaxial layer 62 utilizing the ion implantation methods of U.S. Pat. No. 5,087,576. As will be appreciated by one of skill in the art, the ion implantation may optionally occur prior to growth of the third epitaxial layer 60. In such a case, the trenches must be registered to the implanted regions so that the trenches coincided with the regions such that the bottom of the trench corresponds to an implanted region. After the device is etched and the gate grid 70 created, ohmic contacts may be formed for the cathode and the gate contact where the gate contact is formed in the bottom of ion implanted trenches and the cathode contact 82 is formed on the fourth epitaxial layer 66.

The entire device is etched to form a mesa. The mesa preferably extends past the depletion region of the device to confine current flow in the device to the mesa and reduce the capacitance of the device. If the depletion region of the device extends below the level of the mesa then it spreads to areas outside the mesa, resulting in larger capacitance. The mesa is preferably formed by reactive ion etching the above described device, however other methods of forming known to one skilled in the art may be used to form the mesa. After formation of the mesa, an insulating layer 78 of, for example, silicon dioxide, may be formed over the exposed surfaces of the device, including the sidewalls of the mesa, to passivate the device. While $SiO_2$ is the preferred insulating material, other insulating materials known to those of skill in the art may be utilized.

The device of FIG. 2B may be created by carrying out the above steps but including forming an epitaxial layer 52 of $p^+$ silicon carbide on the substrate 50 prior to formation of the first epitaxial layer 60. The device of FIG. 4 may be formed by creating the device of FIG. 2A and prior to creation of the insulating layer forming regions of $p^+$ silicon carbide 51 at the base of the mesa. An ohmic contact 88 can then be formed on these regions to create a sinker anode. Furthermore, the device of FIG. 2B may be modified to include a sinker anode by only etching the mesa to the $p^+$ layer 52 and then forming an ohmic contact at the base of the mesa. The complementary devices of those described above with reference to FIGS. 2A, 2B and 4 may be created by utilizing the above described method but by substituting $n^+$ silicon carbide for $p^+$ silicon carbide, $p^-$ silicon carbide for $n^-$ silicon carbide and $p^+$ silicon carbide for $n^+$ silicon carbide.

The tunnel diode devices of FIGS. 5 and 6 may be fabricated utilizing the techniques described above with respect to FIGS. 1B and 2B respectively, however, for the tunnel diode devices the substrate 10 and 50 are $n^+$ silicon carbide. The remainder of the fabrication process is the same as that described above for the respective devices.

In the event that the first, second and third epitaxial layers have the same carrier concentration, then these layers may be formed as a single epitaxial layer and the devices of FIGS. 7 and 8 may be created. The devices of FIGS. 7 and 8 are created utilizing the same techniques as those utilized in creating the devices of FIGS. 2A, 2B, 4, and 6, however, rather than growing three epitaxial layers a single $n^-$ epitaxial layer 164 is grown using the methods previously described. Trenches 174 are then etched to a predetermined depth into the first epitaxial layer 164 and $p^+$ regions formed by ion implantation at the bottom of the trenches as described above. The formation of ohmic contacts, mesas and insulating layers are carried out as described herein with respect to FIGS. 2A, 2B, 4, and 6. Furthermore, as will be appreciated by one of skill in this art, to the extent that any two adjacent epitaxial layers in the devices of FIGS. 1A through 6 are of the same conductivity type and have the same carrier concentration, these layers may be formed as a single epitaxial layer unless such a formation prevents implantation of the gate grid.

In operation, the devices of the present invention are normally on and allow current to flow from the anode to the cathode of the device. When a bias is applied to the gate grid to create a reverse biased pn junction which pinches off the current conduction path between the elements of the gate grid. During turn off a gate current extracts the electron hole plasma in the conducting channel between the gate grid elements which enables the device to support anode/cathode voltage. Furthermore, the devices of the present invention should offer very high on-state current densities through minority carrier injection into the low doped drift layer. These devices should allow for switching of current densities greater than 500 A/$cm^2$ during the on state of the device. These devices should also exhibit low on-state resistance.

With respect to the $n^-$ drift region device, to operate the device in the forward blocking mode, a sufficiently large negative voltage is applied to the gate to form a potential barrier in the $n^-$ region between the gate grid elements which prevents the flow of current. Higher negative voltages on the gate allow for higher voltages on the anode to be blocked until the maximum blocking voltage capability of the device is reached. This capability is determined by either the gate breakdown voltage of the properties of the first epitaxial layer (20, 60). When the gate voltage is switched from positive to negative with respect to the cathode, the carriers in the channel region must be extracted via the gate before the device can begin to support voltage. During this charge extraction, a constant gate current flow for an interval called the storage time. Once the stored charge in the channel has been removed, a potential barrier is formed allowing the device to support voltage. Thereafter, stored charge in the drift region decays by carrier recombination. This leads to a decrease in anode current in a time interval called the fall time. The storage time and the fall time both impact on the switching characteristics of the field controlled device and limit the speed at which such devices can switch.

As stated earlier, the formation of the $p^+$ gate grid or the $n^+$ gate grid is achieved via ion implantation into the low doped blocking layer. For the buried gate embodiments of FIGS. 1A, 1B, 3 and 5, another low doped epitaxial layer must be grown on top of the implanted region that is thick enough to support the reverse bias depletion region that is formed when the gate junction is biased. The thickness of the subsequent low doped layer is dictated by the intended maximum gate voltage. It must be thick enough to support a gate-top-side electrode (either anode or cathode depending on the device polarity) voltage greater than the device's rated maximum voltage divided by the voltage blocking gain described below.

The crystalline quality of the first epitaxial layer after the ion implantation must be good enough to support the reverse bias that will be placed on the gate to pinch off the device. For a field controlled device this bias can reach as much as 50 V but will more typically be in the range from 10 V to 20 V. The gate voltage which corresponds to pinch off of the regions between the gate grid may be approximated by the following equation:

$$V_G = V_{bi} - \frac{(qN_D(S/2))^2}{2\varepsilon_S}$$

where q is the electron charge, $N_D$ is the doping level of the second epitaxial region, S is the gap between the elements of the gate grid, $\epsilon_s$ is the permitivity of SiC and $V_{bi}$ is the built in potential of the gate junction. $V_{bi}$ is given by the equation:

$$V_{bi} = \frac{kT}{q}\ln\left(\frac{N_A N_D}{n_i^2}\right)$$

where k is Boltzmann's Constant, T is the temperature in Kelvin, $N_D$ is the n-region concentration, $N_A$ is p-region concentration and $n_i$ is intrinsic concentration of SiC. Thus, $V_G$ may be controlled by selection of the spacing of the gate grid elements and the doping concentration of the drift region.

The forward blocking voltage gain of the device may be approximated by the following equation:

$$Gain \approx \frac{LW_d}{S^2}$$

where L is the thickness of the implanted regions of the gate grid, $W_d$ is the depletion width of the gate junction in the direction toward the anode and S is the gap between the implanted regions of the gate grid.

The forward on-state I-V relationship with a minimal bias may be approximated using the following equation:

$$I_A = \frac{4AqD_a n_i}{x_n} e^{\frac{qV_{AK}}{2kT}}$$

where $I_A$ is the anode current, A is anode area, $D_a$ is the ambipolar diffusion coefficient, $n_i$ is intrinsic concentration of SiC, $V_{AK}$ is the anode-cathode voltage, and $X_n$ is drift region thickness.

For forward bias with a larger reverse gate bias, pinch-off is introduced and a potential barrier for electrons is formed that impedes their transport from the cathode to the anode. This barrier limits the electron supply and becomes the controlling factor for the overall current. The barrier height, $\phi_B$, is not only controlled by the gate voltage but can also be lowered by a large $V_{AK}$. The dependence of $\phi_B$ on $V_{AK}$ is called static induction and is dependent on the dimensions of the device gate structure. In such a case, the anode current maybe approximated by the following equation:

$$I_A = I_0 e^{\frac{q(\eta V_G + \theta V_{AK})}{kT}}$$

where $I_O$ is saturation current and $\eta$ and $\theta$ are constants for a given device structure and indicate the control of $V_G$ and $V_{AK}$ on the barrier height.

In selecting between the devices described above, the devices described above which have a buried gate structure allow for a more efficient use of the cathode/anode area using conventional fabrication techniques and more efficient gate control of the current which results in a lower on-state resistance and a higher forward blocking voltage gain. With regard the devices described above having the gate grid formed at the bottom of trenches, the devices exhibit lower gate grid resistance which results in a smaller gate debiasing effect during turn off.

The layout of the gate-cathode or gate-anode metallization plays an important role in determining the on state voltage drop, the switching speed and the blocking gain of the field controlled device. The layout of this metallization should ensure that the flow of current is uniform across the entire die of the device. This results in a lower on state resistance, faster switching speeds and a high blocking gain. While many layout schemes may be utilized with the present invention, the involute gate structure is preferred. However, simple rectangular layout schemes which may also be utilized are illustrated in FIGS. 9 and 10.

Based upon the above discussion, the devices according to the present invention will typically have an overall low doped region (layer 20 or layer 60) thickness of from about 10μ to about 300μ. The thickness of the layers is dependent upon the breakdown voltages desired. The gap (S) between the implanted regions or the trenches which make up the gate grid of the devices according to the present invention should be as small as possible with typical distances being between about 0.5μ and about 5μ. The width of the elements of the buried gate grid or the implanted regions of the gate grid formed in trenches may also be from about 0.5μ to about 5μ. These regions may be formed at various depths into the epitaxial layers having lower carrier concentrations. Suitable depths for the gate grid may be from about 5 Å to the thickness of the epitaxial layer. The thickness or depth (L) of the implanted regions which comprise the gate grid should be as thick as possible but about 500 Å to about 5μ may be suitable. Suitable thicknesses for the high carrier concentration epitaxial layer on which the first ohmic contact is formed are from about 500 Å to about 5μ.

With regard to the doping of the $p^+$ or alternatively the $n^+$ conductivity type regions and epitaxial layers, these regions should be as heavily doped as possible without causing excessive fabrication defects. Carrier concentrations of greater than about $1\times10^{18}$ are suitable for these regions and epitaxial layers, however, carrier concentrations of greater than about $1\times10^{18}$ are preferred. Suitable dopants for producing the p-type regions include aluminum, boron or gallium. Suitable dopants for producing the n-type regions include nitrogen and phosphorous. Aluminum is the preferred dopant for the $p^+$ regions and it is preferred that the aluminum be implanted in the $p^+$ regions using high temperature ion implantation such as is described above and employing temperatures of between 1000° C. and 1500° C. Carrier concentrations of up to about $3\times10^{17}$ $cm^{-3}$ are suitable for the $n^-$ or $p^-$ epitaxial layers, however, carrier concentrations of about $3\times10^{16}$ or less are preferred. With regard to the multiple $n^-$ or $p^-$ epitaxial layers, carrier concentrations of from about $\mathbf{1\times10}^{13}$ to about $5\times10^{16}$ are suitable for the first epitaxial layer which lies below the gate grid. Carrier concentrations of from about $1\times10^{13}$ to about $\mathbf{1\times10}^{16}$ are suitable for the second epitaxial layer in which the gate grid is formed. Carrier concentrations of from about $5\times10^{17}$ to about $5\times10^{19}$ are suitable for the third epitaxial layer which lies above the gate grid. As discussed above, the relative carrier concentrations may be varied between the three epitaxial layers, however, the preferred carrier concentrations are $1\times10^{15}$ for the first epitaxial layer, $1\times10^{14}$ for the second epitaxial layer and $5\times10^{15}$ for the third epitaxial layer. Thus, the gate grid is preferably formed in the epitaxial layer having the lowest carrier concentration.

Based upon the above characteristics of the devices according to the present invention, such devices may have switching times of between 50 and 500 nsec as compared to the 2 to 100 μsec switching times of other field controlled devices depending on their voltage ratings. The devices of the present invention should also exhibit forward breakdown voltages of as high as 10000 V and reverse breakdown voltages of equal magnitude. Blocking gains of 50 or greater should be provided by devices according to the present invention. Blocking voltages of 2000 V should, therefore, be attainable with gate voltages as low as 40 V. These devices should also be capable of current densities of 500 A/$cm^2$ or greater. Finally, these devices should be capable of operating at temperatures in excess of 400° C.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A high voltage, high current field control bipolar switch comprising:

- a bulk single crystal silicon carbide substrate of a first conductivity type having an upper surface and a lower surface;
- a first epitaxial layer of a second conductivity type silicon carbide upon said upper surface of said substrate;
- a second epitaxial layer of said second conductivity type silicon carbide formed on said first epitaxial layer of silicon carbide;
- a plurality of regions of a third conductivity type silicon carbide formed in said second epitaxial layer to form a gate grid in said second epitaxial layer;
- a third epitaxial layer of said second conductivity type silicon carbide formed on said second epitaxial layer;
- a fourth epitaxial layer of said second conductivity type silicon carbide upon said third epitaxial layer said fourth epitaxial layer having a higher carrier concentration than is present in said first epitaxial layer, said second epitaxial layer and said third epitaxial layer;
- a first ohmic contact upon said fourth epitaxial layer;
- a second ohmic contact formed on said lower surface of said substrate; and
- an ohmic gate contact connected to said gate grid for pinching off the flow of current between said first ohmic contact and said second ohmic contact when a bias is applied to said ohmic gate contact.

2. A field controlled bipolar switch according to claim 1 wherein said second epitaxial layer has a lower carrier concentration than said first epitaxial layer.

3. A field controlled bipolar switch according to claim 2 wherein said third epitaxial layer and said first epitaxial layer have substantially the same carrier concentration.

4. A field controlled bipolar switch according to claim 2 wherein said third epitaxial layer and said second epitaxial layer have substantially the same carrier concentration.

5. A field controlled bipolar switch according to claim 1, said device further comprising a fifth epitaxial layer of a fourth conductivity type, wherein said fifth epitaxial layer is formed on said upper surface of said substrate and disposed between said substrate and said first epitaxial layer and wherein said first epitaxial layer is formed on said fifth epitaxial layer.

6. A field controlled bipolar switch according to claim 1 wherein said first conductivity type and said third conductivity type are p-type conductivity and wherein said second conductivity type is n-type conductivity and wherein said first ohmic contact is a cathode contact and said second ohmic contact is an anode contact.

7. A field controlled bipolar switch according to claim 1 wherein said first conductivity type and said third conductivity type are n-type conductivity and wherein said second conductivity type is p-type conductivity and wherein said first ohmic contact is an anode contact and said second ohmic contact is a cathode contact.

8. A field controlled bipolar switch according to claim 5 wherein said first conductivity type is n-type conductivity, said second conductivity type is n-type conductivity and said third conductivity type is p-type conductivity and said fourth conductivity type is p-type conductivity and wherein said first ohmic contact is a cathode contact and said second ohmic contact is an anode contact.

9. A field controlled bipolar switch according to claim 1 wherein said substrate and said first, second, third and fourth epitaxial layers form a mesa having sidewalls which define the periphery of said device, said sidewalls of said mesa extending downward into said substrate.

10. A field controlled bipolar switch according to claim 9, further comprising:

- regions of said first conductivity type silicon carbide formed in said substrate at the base of said mesa; and
- ohmic contacts electrically connected to said second ohmic contact formed on said regions of said first conductivity type silicon carbide.

11. A field controlled bipolar switch according to claim 5 wherein said first, second, third, fourth and fifth epitaxial layers form a mesa having sidewalls which define the periphery of said device, said sidewalls of said mesa extending downward through said first, second, third and fourth epitaxial layers and into said fifth epitaxial layer.

12. A field controlled bipolar switch according to claim 11 further comprising ohmic contacts electrically connected to said second ohmic contact formed on said fifth epitaxial layer at the base of said sidewalls of said mesa.

13. A field controlled bipolar switch according to claim 9 further comprising an insulating layer formed on said sidewalls of said mesa to passivate said sidewalls.

14. A field controlled bipolar switch according to claim 1 wherein said silicon carbide comprises 4H silicon carbide.

15. A field controlled bipolar switch according to claim 1 wherein said gate grid comprises a plurality of parallel fingers.

16. The high voltage, high current field controlled bipolar switch of claim 1, further comprising:

a plurality of trenches formed in said third and said fourth epitaxial layers wherein said plurality of regions of said third conductivity type silicon carbide formed in said second epitaxial layer are at the bottom of said plurality of trenches; and wherein said ohmic gate contact comprises an ohmic gate contact formed on said third conductivity type silicon carbide formed in said trenches.

17. A field controlled bipolar switch according to claim 16 wherein said second epitaxial layer has a lower carrier concentration than said first epitaxial layer.

18. A field controlled bipolar switch according to claim 17 wherein said third epitaxial layer and said first epitaxial layer have substantially the same carrier concentration.

19. A field controlled bipolar switch according to claim 17 wherein said third epitaxial layer and said second epitaxial layer have substantially the same carrier concentration.

20. The high voltage, high current field controlled bipolar switch of claim 16, said device further comprising a fifth epitaxial layer of a fourth conductivity type, wherein said fifth epitaxial layer is formed on said upper surface of said substrate and disposed between said substrate and said first epitaxial layer and wherein said first epitaxial layer is formed on said fifth epitaxial layer.

21. A field controlled bipolar switch according to claim 16 wherein said first conductivity type and said third conductivity type are p-type conductivity and wherein said second conductivity type is n-type conductivity and wherein said first ohmic contact is a cathode contact and said second ohmic contact is an anode contact.

22. A field controlled bipolar switch according to claim 16 wherein said first conductivity type and said third conductivity type are n-type conductivity and wherein said second conductivity type is p-type conductivity and wherein said first ohmic contact is an anode contact and said second ohmic contact is a cathode contact.

23. A field controlled bipolar switch according to claim 20 wherein said first conductivity type is n-type conductivity, said second conductivity type is n-type conductivity and said third conductivity type is p-type conductivity and said fourth conductivity type is p-type conductivity and wherein said first ohmic contact is a cathode contact and said second ohmic contact is an anode contact.

24. A field controlled bipolar switch according to claim 16 wherein said substrate and said first, second, third and fourth epitaxial layers form a mesa having sidewalls which define the periphery of said bipolar switch, said sidewalls of said mesa extending downward into said substrate.

25. A field controlled bipolar switch according to claim 24, further comprising:

regions of said first conductivity type silicon carbide formed in said substrate at the base of said mesa; and ohmic contacts electrically connected to said second ohmic contact formed on said regions of said second conductivity type silicon carbide.

26. A field controlled bipolar switch according to claim 20 wherein said first, second, third, fourth and fifth epitaxial layers form a mesa having sidewalls which define the periphery of said device, said sidewalls of said mesa extending downward through said first, second, third and fourth epitaxial layers and into said fifth epitaxial layer.

27. A field controlled bipolar switch according to claim 26 further comprising ohmic contacts electrically connected to said second ohmic contact formed on said fifth epitaxial layer at the base of said sidewalls of said mesa.

28. A field controlled bipolar switch according to claim 24 further comprising an insulating layer formed on said sidewalls of said mesa to passivate said sidewalls.

29. A field controlled bipolar switch according to claim 16 wherein said silicon carbide comprises 4H silicon carbide.

30. A field controlled bipolar switch according to claim 16 wherein said gate grid comprises a plurality of connected interdigited fingers.

31. A field controlled bipolar switch according to claim 30 wherein said ohmic gate contact comprises a plurality of interdigited fingers formed on said interdigited fingers of said gate grid such that said fingers of said ohmic gate contact are substantially parallel to said fingers of said gate grid; and wherein said first ohmic contact comprises a plurality of interdigited fingers formed on said fourth epitaxial layer and interspersed between the fingers of said ohmic gate contact.

32. A high voltage, high current field control bipolar switch comprising:

a bulk single crystal silicon carbide substrate of a first conductivity type having an upper surface and a lower surface;

a first epitaxial layer of a second conductivity type silicon carbide upon said upper surface of said substrate;

a plurality of regions of a third conductivity type silicon carbide formed in said first epitaxial layer to form a gate grid in said first epitaxial layer;

a second epitaxial layer of said second conductivity type silicon carbide formed on said first epitaxial layer of silicon carbide;

a third epitaxial layer of said second conductivity type silicon carbide upon said second epitaxial layer said third epitaxial layer having a higher carrier concentration than is present in said first epitaxial layer and said second epitaxial layer;

a first ohmic contact upon said third epitaxial layer;

a second ohmic contact formed on said lower surface of said substrate; and an ohmic gate contact connected to said gate grid for pinching off the flow of current between said first ohmic contact and said second ohmic contact when a bias is applied to said ohmic gate contact.

33. A field controlled bipolar switch according to claim 32 wherein said second epitaxial layer and said first epitaxial layer have substantially the same carrier concentration.

34. A field controlled bipolar switch according to claim 32, said device further comprising a fourth epitaxial layer of a fourth conductivity type, wherein said fourth epitaxial layer is formed on said upper surface of said substrate and disposed between said substrate and said first epitaxial layer and wherein said first epitaxial layer is formed on said fourth epitaxial layer.

35. A field controlled bipolar switch according to claim 32 wherein said first conductivity type and said third conductivity type are p-type conductivity and wherein said second conductivity type is n-type conductivity and wherein said first ohmic contact is a cathode contact and said second ohmic contact is an anode contact.

36. A field controlled bipolar switch according to claim 32 wherein said first conductivity type and said third conductivity type are n-type conductivity and wherein said second conductivity type is p-type conductivity and wherein said first ohmic contact is an anode contact and said second ohmic contact is a cathode contact.

37. A field controlled bipolar switch according to claim 34 wherein said first conductivity type is n-type conductivity, said second conductivity type is n-type conductivity and said third conductivity type is p-type conductivity and said fourth conductivity type is p-type conductivity and wherein said first ohmic contact is a cathode contact and said second ohmic contact is an anode contact.

38. A field controlled bipolar switch according to claim 32 wherein said substrate and said first, second, and third epitaxial layers form a mesa having sidewalls which define the periphery of said device, said sidewalls of said mesa extending downward into said substrate.

39. A field controlled bipolar switch according to claim 38, further comprising:

regions of said first conductivity type silicon carbide formed in said substrate at the base of said mesa; and ohmic contacts electrically connected to said second ohmic contact formed on said regions of said first conductivity type silicon carbide.

40. A field controlled bipolar switch according to claim 34 wherein said first, second, third and fourth epitaxial layers form a mesa having sidewalls which define the periphery of said device, said sidewalls of said mesa extending downward through said first, second and third epitaxial layers and into said fourth epitaxial layer.

41. A field controlled bipolar switch according to claim 40 further comprising ohmic contacts electrically connected to said second ohmic contact formed on said fourth epitaxial layer at the base of said sidewalls of said mesa.

42. A field controlled bipolar switch according to claim 38 further comprising an insulating layer formed on said sidewalls of said mesa to passivate said sidewalls.

43. The high voltage, high current field controlled bipolar switch of claim 32, further comprising:

a plurality of trenches formed in said second and said third epitaxial layers wherein said plurality of regions of said third conductivity type silicon carbide formed in said first epitaxial layer are at the bottom of said plurality of trenches; and wherein said ohmic gate contact comprises an ohmic gate contact formed on said third conductivity type silicon carbide formed in said trenches for pinching off the flow of current between said first ohmic contact and said second ohmic contact when a bias is applied to said ohmic gate contact.

44. A field controlled bipolar switch according to claim 43 wherein said first epitaxial layer has a lower carrier concentration than said second epitaxial layer.

45. The high voltage, high current field controlled bipolar switch of claim 43, said device further comprising a fourth epitaxial layer of a fourth conductivity type, wherein said fourth epitaxial layer is formed on said upper surface of said substrate and disposed between said substrate and said first epitaxial layer and wherein said first epitaxial layer is formed on said fourth epitaxial layer.

46. A field controlled bipolar switch according to claim 43 wherein said first conductivity type and said third conductivity type are p-type conductivity and wherein said second conductivity type is n-type conductivity and wherein said first ohmic contact is a cathode contact and said second ohmic contact is an anode contact.

47. A field controlled bipolar switch according to claim 43 wherein said first conductivity type and said third conductivity type are n-type conductivity and wherein said second conductivity type is p-type conductivity and wherein said first ohmic contact is an anode contact and said second ohmic contact is a cathode contact.

48. A field controlled bipolar switch according to claim 45 wherein said first conductivity type is n-type conductivity, said second conductivity type is n-type conductivity and said third conductivity type is p-type conductivity and said fourth conductivity type is p-type conductivity and wherein said first ohmic contact is a cathode contact and said second ohmic contact is an anode contact.

49. A field controlled bipolar switch according to claim 43 wherein said substrate and said first, second and third epitaxial layers form a mesa having sidewalls which define the periphery of said transistor, said sidewalls of said mesa extending downward into said substrate.

50. A field controlled bipolar switch according to claim 49, further comprising:

regions of said first conductivity type silicon carbide formed in said substrate at the base of said mesa; and ohmic contacts electrically connected to said second ohmic contact formed on said regions of said second conductivity type silicon carbide.

51. A field controlled bipolar switch according to claim 45 wherein said first, second, third and fourth epitaxial layers form a mesa having sidewalls which define the periphery of said bipolar switch, said sidewalls of said mesa extending downward through said first, second and third epitaxial layers and into said fourth epitaxial layer.

52. A field controlled bipolar switch according to claim 51 further comprising ohmic contacts electrically connected to said second ohmic contact formed on said fourth epitaxial layer at the base of said sidewalls of said mesa.

53. A field controlled bipolar switch according to claim 49 further comprising an insulating layer formed on said sidewalls of said mesa to passivate said sidewalls.

54. A field controlled bipolar switch according to claim 43 wherein said gate grid comprises a plurality of connected interdigited fingers.

55. A field controlled bipolar switch according to claim 54 wherein said ohmic gate contact comprises a plurality of interdigited fingers formed on said interdigited fingers of said gate grid such that said fingers of said ohmic gate contact are substantially parallel to said fingers of said gate grid; and wherein said first ohmic contact comprises a plurality of interdigited fingers formed on said third epitaxial layer and interspersed between the fingers of said ohmic gate contact.

56. A high voltage, high current field control bipolar switch comprising:

a bulk single crystal silicon carbide substrate of a first conductivity type having an upper surface and a lower surface;

a first epitaxial layer of a second conductivity type silicon carbine upon said upper surface of said substrate;

a second epitaxial layer of said second conductivity type silicon carbide upon said first epitaxial layer, said second epitaxial layer having a higher carrier concentration than is present in said first epitaxial layer;

a plurality of trenches formed through said second epitaxial layer and into said first epitaxial layer;

a plurality of regions of a third conductivity type silicon carbide formed in said first epitaxial layer at the bottom of said plurality of trenches to form a gate grid in said first epitaxial layer;

a first ohmic contact upon said second epitaxial layer;

a second ohmic contact formed on said lower surface of said substrate; and an ohmic gate contact formed on said third conductivity type silicon carbide regions in said trenches for pinching off the flow of current between said first ohmic contact and said second ohmic contact when a bias is applied to said ohmic gate contact.

57. A field controlled bipolar switch according to claim 56 further comprising a third epitaxial layer of a fourth conductivity type silicon carbide formed on said upper surface of said substrate and disposed between said substrate and said first epitaxial layer wherein said first epitaxial layer is formed on said third epitaxial layer.

58. A field controlled bipolar switch according to claim 56 wherein said first conductivity type and said third conductivity type are p-type conductivity and wherein said second conductivity type is n-type conductivity and wherein said first ohmic contact is a cathode contact and said second ohmic contact is an anode contact.

59. A field controlled bipolar switch according to claim 56 wherein said first conductivity type and said third conductivity type are n-type conductivity and wherein said second conductivity type is p-type conductivity and wherein said first ohmic contact is an anode contact and said second ohmic contact is a cathode contact.

60. A field controlled bipolar switch according to claim 57 wherein said first conductivity type is n-type conductivity, said second conductivity type is n-type conductivity and said third conductivity type is p-type conductivity and said fourth conductivity type is p-type conductivity and wherein said first ohmic contact is a cathode contact and said second ohmic contact is an anode contact.

61. A field controlled bipolar switch according to claim 56 where said substrate and said first and second epitaxial layers form a mesa having sidewalls which define the periphery of said bipolar switch, said sidewalls of said mesa extending downward into said substrate.

62. A field controlled bipolar switch according to claim 61 further comprising an insulating layer formed on said sidewalls of said mesa to passivate said sidewalls.

63. A field controlled bipolar switch according to claim 56 wherein said gate grid comprises a plurality of connected interdigited fingers.

64. A field controlled bipolar switch according to claim 63 wherein said ohmic gate contact comprises a plurality of interdigited fingers formed on said interdigited fingers of said gate grid such that said fingers of said ohmic gate contact are substantially parallel to said fingers of said gate grid; and wherein said first ohmic contact comprises a plurality of interdigited fingers formed on said second epitaxial layer and interspersed between the fingers of said ohmic gate contact.

* * * * *

UNITED STATES PATENT AND TRADEMARK OFFICE

CERTIFICATE OF CORRECTION

PATENT NO. : 6,011,279
DATED : January 4, 2000
INVENTOR(S) : Singh, et al.

It is certified that error appears in the above-identified patent and that said Letters Patent is hereby corrected as shown below:

Title Page:

In Foreign Patent Documents:
Delete "94 11 601 U 7/1994 United Kingdom" and replace with -G9411601.6 7/1994 Germany—.

In Col. 11, line 55, after "gate contact 184", insert a paragraph break.

Signed and Sealed this

Twelfth Day of June, 2001

Nicholas P. Godici

*Attest:*

NICHOLAS P. GODICI

*Attesting Officer* *Acting Director of the United States Patent and Trademark Office*